(12) United States Patent
Nagata et al.

(10) Patent No.: US 7,309,145 B2
(45) Date of Patent: Dec. 18, 2007

(54) LIGHT SOURCE APPARATUS AND PROJECTION DISPLAY APPARATUS

(75) Inventors: Mitsuo Nagata, Suwa (JP); Takeshi Seto, Chofu (JP); Kunihiko Takagi, Okaya (JP); Tomo Ikebe, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 208 days.

(21) Appl. No.: 11/031,061

(22) Filed: Jan. 10, 2005

(65) Prior Publication Data

US 2005/0168990 A1 Aug. 4, 2005

(30) Foreign Application Priority Data

Jan. 13, 2004 (JP) ............................ 2004-005411
Jan. 15, 2004 (JP) ............................ 2004-007903
Nov. 15, 2004 (JP) ............................ 2004-330534

(51) Int. Cl.
*F21V 29/00* (2006.01)
*H05K 7/20* (2006.01)

(52) U.S. Cl. ....................... 362/294; 362/373; 257/714; 361/688

(58) Field of Classification Search .......... 257/79–103, 257/98–100, 712–722, 687, 706, 707; 353/54; 361/676–678, 688–723; 362/273, 294, 318, 362/373, 264, 547, 345, 218, 126, 96, 580; 165/104.33, 80.4

See application file for complete search history.

(56) References Cited

U.S. PATENT DOCUMENTS

| | | | |
|---|---|---|---|
| 3,999,897 A * | 12/1976 | Strub | 417/423.13 |
| 4,712,609 A * | 12/1987 | Iversen | 165/80.4 |
| 5,282,121 A * | 1/1994 | Bornhorst et al. | 362/294 |
| 5,522,452 A * | 6/1996 | Mizuno et al. | 165/286 |
| 5,647,662 A * | 7/1997 | Ziegler et al. | 362/294 |
| 5,857,768 A * | 1/1999 | Ziegler et al. | 362/294 |
| 5,890,794 A * | 4/1999 | Abtahi et al. | 362/294 |
| 6,055,154 A * | 4/2000 | Azar | 361/688 |
| 6,498,355 B1 | 12/2002 | Harrah et al. | |
| 6,815,724 B2 * | 11/2004 | Dry | 257/88 |
| 6,964,501 B2 * | 11/2005 | Ryan | 362/294 |
| 7,066,601 B2 * | 6/2006 | Lee et al. | 353/31 |
| 2002/0002820 A1 * | 1/2002 | Takehara | 60/39.511 |

FOREIGN PATENT DOCUMENTS

| | | | |
|---|---|---|---|
| JP | 06-005923 | * | 1/1994 |
| JP | A-06-005923 | | 1/1994 |
| JP | A-07-099372 | | 4/1995 |
| JP | A-11-052889 | | 2/1999 |

(Continued)

*Primary Examiner*—Sandra O'Shea
*Assistant Examiner*—Bao Q. Truong
(74) *Attorney, Agent, or Firm*—Oliff & Berridge, PLC

(57) ABSTRACT

A light source apparatus including: a solid state light source that includes a pair of electrodes and emits light in response to power being supplied with from the electrodes; a liquid medium that removes heat that is generated in the solid state light source; and a mounting unit which is provided a flow path in an interior thereof in which the liquid medium flows, including: a base that defines the flow path; and a placement member which defines a remainder of the flow path and on which the solid state light source is mounted.

15 Claims, 25 Drawing Sheets

FOREIGN PATENT DOCUMENTS

| | | |
|---|---|---|
| JP | A-11-282361 | 10/1999 |
| JP | A-2001-042435 | 2/2001 |
| JP | A-2003-124524 | 4/2003 |
| JP | A-2003-224238 | 8/2003 |
| JP | A-2003-287815 | 10/2003 |

* cited by examiner

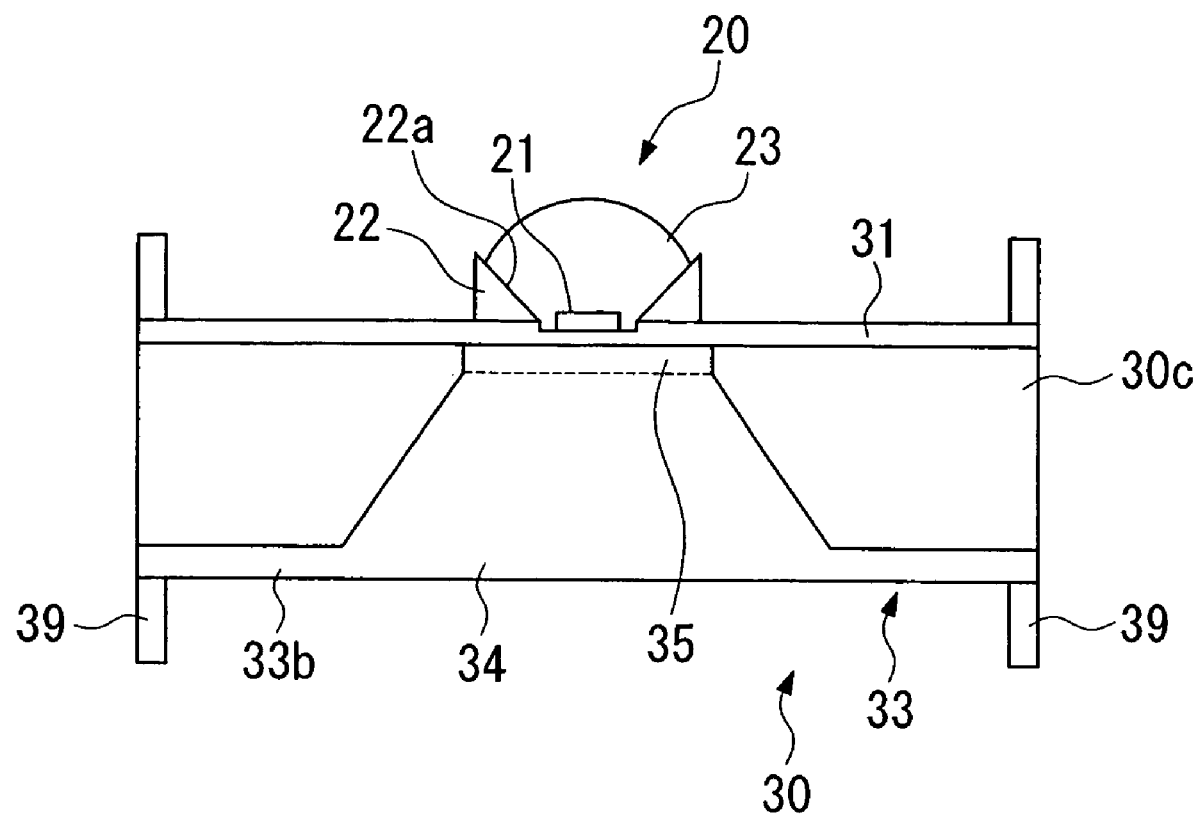

LIGHT SOURCE APPARATUS AND PROJECTION DISPLAY APPARATUS

BACKGROUND OF THE INVENTION

1. Field of the Invention

The present invention relates to a light source apparatus and a projection type display apparatus.

Priority is claimed on Japanese Patent Application No. 2004-5411, filed Jan. 13, 2004, Japanese Patent Application No. 2004-7903, filed Jan. 15, 2004, and Japanese Patent Application No. 2004-330534, filed Nov. 15, 2004 the contents of which are incorporated herein by reference.

2. Description of Related Art

Projectors (i.e., projection type display apparatuses) have in recent years achieved reductions in size, improvements in luminance, longer life spans, and reductions in cost. For example, as far as size reductions are concerned, the size of liquid crystal panels (i.e., optical modulators) has been reduced from 1.3 inches diagonally to 0.5 inches so that a size reduction of more than one sixth (as a surface ratio) is achieved.

It has also been proposed that a reduction in size can be achieved by using a light emitting diode (i.e., LED), which is a solid state light source, as the light source of a projector.

LED light sources are small in size while including a power source, and have merit as the light source of a projector in that they allow instantaneous ON and OFF and have broad color reproducibility and long life spans. In addition, because they contain no harmful substances such as mercury, they are preferable from the viewpoint of environmental protection.

However, because the brightness of an LED light source is insufficient as the light source of a projector, for an LED light source to be used as the light source of a projector, it has been necessary to ensure at least the level of brightness of a discharge type of light source lamp (i.e., it has been necessary to raise the luminance and lower the etendue). Here, the term "etendue" refers to a numerical value that indicates a spatial expanse in which luminous flux that can be effectively used is present expressed as the product of a surface area and a solid angle. Moreover, the etendue is optically preserved. As described above, because a reduction in the size of liquid crystal panels has been achieved and the etendue of liquid crystal panels has been reduced, it is also necessary to reduce the etendue of the light source comparably or smaller.

However, as the level of brightness of LED light sources has increased, the heat generated from LED light sources has also further increased. However, if the temperature of an LED light source rises, the light emission efficiency thereof deteriorates, so that some type of countermeasure against heat has been required. In the forced air-cooling system using a fan that is generally employed, the cooling effect is insufficient and the noise from the fan has created problems. For this reason, methods for forcibly cooling an LED light source using a liquid have been proposed. From a liquid cooling method, an effect of nullifying the noise generated in the forced air-cooling system is also anticipated (for example, in Japanese Unexamined Patent Application, First Publication Nos. H06-005923 and H07-099372).

In the LED light source disclosed in Japanese Unexamined Patent Application, First Publication No. H06-005923, by circulating a coolant such as liquid nitrogen or the like around the LED, the LED and the coolant are placed in direct contact with each other so as to achieve forced cooling. However, because the structure of the LED light source is complex such as an insulating casing being necessary and the like, the manufacture thereof is not practical. Therefore, the problem arises that it is difficult to ensure at the least the brightness level of a discharge type light source lamp.

In the LED light source disclosed in Japanese Unexamined Patent Application, First Publication No. H07-099372, the periphery of an LED chip (i.e., the light emitting chip) is filled with an insulating inert liquid so as to cool the LED chip. However; a device for actively cooling the insulating inert liquid is not provided, so that the cooling effect is low and it is difficult to cool an LED chip for an extended period of time. Consequently, the problem arises that it is difficult to ensure at the least the brightness level of a discharge type light source lamp.

SUMMARY OF THE INVENTION

In order to solve the above-described problems, the light source apparatus of the present invention includes: a solid state light source that includes a pair of electrodes and emits light in response to power being supplied with from the electrodes; a liquid medium that removes heat that is generated in the solid state light source; and a mounting unit which is provided a flow path in an interior thereof in which the liquid medium flows, including: a base that defines the flow path; and a placement member which defines a remainder of the flow path and on which the solid state light source is mounted and, wherein the mounting unit is made of a metal, and a thickness of the mounting unit between an outer surface of the mounting unit and the flow path is smaller than a thickness of the base between an outer surface of the base and the flow path in a region where at least the solid state light source is mounted.

That is, in the light source apparatus of the present invention, because the mounting unit that is interposed between the solid state light source and the liquid medium is made of a metal having a high thermal conductivity, heat that is generated in the solid state light source can be efficiently dissipated to the liquid medium. In addition, because the thickness of the mounting unit between the outer surface of the mounting unit and the flow path in a region where at least the solid state light source is mounted is smaller than the thickness of the base between the outer surface of the base and the flow path, heat that is generated in the solid state light source can be even more efficiently dissipated to the liquid medium, enabling the solid state light source to be efficiently cooled. Note that if the temperature of the liquid medium is lower than that of the outside air, then by making the thickness of the base between the outer surface of the base and the flow path sufficiently thicker than the thickness of the mounting unit between the outer surface of the mounting unit and the flow path, it becomes difficult for heat from the outside to be transferred to the liquid medium, so that the temperature of the liquid medium can be prevented from increasing. This enables the efficiency with which the solid state light source is cooled to be improved. As a result, it becomes possible to increase the power that is input into the solid state light source. This enables the amount of light that can be emitted from the solid state light source to be increased, thereby enabling an increase in luminance to be achieved. In contrast, if the temperature of the liquid medium is higher than that of the outside air, then by installing a cooling fin or the like in the base, the heat from the liquid medium is dissipated via the cooling fin. Consequently, it is possible to prevent the temperature of the liquid medium from rising, and the efficiency with which the solid state light source is cooled can be improved.

Moreover, even if the surface area of the solid state light source is decreased and the etendue is lowered so that, additionally, a reduction in the size of the light source apparatus is achieved, because the amount of power that is input can be raised, a high level of luminance can still be maintained.

In order to achieve the above-described structure, preferably, the mounting unit is fabricated by welding the base and the mounting unit.

According to this structure, because it is possible to raise the bonding strength between the base and the mounting unit, the pressure of the liquid medium can be increased, resulting in an increase in the flow quantity and flow rate of the liquid medium that is flowing in the flow path becoming possible. If the flow quantity and flow rate of the liquid medium are increased, then it is possible to increase the amount of heat that can be removed from the solid state light source, and the solid state light source can be cooled more efficiently.

In order to achieve the above-described structure, preferably, the mounting unit is made of a material that has electroconductivity, and serves as one of the electrodes that supply power to the solid state light source.

According to this structure, because the mounting unit also functions as one of the electrodes that supply power to the solid state light source, the gap between the solid state light source and the mounting unit can be narrowed to the extent of the thickness of one electrode. As a result, the heat generated in the solid state light source can be more easily dissipated to the liquid medium, enabling the solid state light source to be cooled more easily.

In order to achieve the above-described structure, preferably, a cross-sectional area of an area where at least the solid state light source is mounted is smaller than a cross-sectional area of the remainder of the flow path.

According to this structure, the flow rate of the liquid medium that is flowing through an area where the solid state light source is placed is increased. If the flow rate of the liquid medium is faster than a predetermined flow rate, then the flow of the liquid medium changes from a laminar flow to a turbulent flow. In a turbulent flow, unlike the case in a laminar flow, liquid medium also moves in a direction orthogonal to the main direction of the flow. As a result, the liquid medium is able to carry the heat that it has received from the surface of the mounting unit with which it is in contact into the central portion of the flow. In addition, liquid medium in low temperatures that had been flowing through the central portion moves to the contact surface of the mounting unit and once again is able to receive heat. That is, by increasing the flow rate of the liquid medium so that the flow changes to a turbulent flow, it is possible to remove heat from the solid state light source more efficiently.

Moreover, even if the flow of the liquid medium remains a laminar flow, if the flow rate thereof is increased, the heat transport capacity of the liquid medium is improved and the efficiency with which the solid state light source is cooled can be improved.

In order to achieve the above-described structure, preferably, on the flow path in a region where at least the solid state light source is located, there is provided at least one wall that divides the flow path into at least two portions.

According to this structure, by obstructing a portion of the flow path by providing walls, the cross-sectional area of the flow path can be reduced. This causes the flow rate of the liquid medium to be increased and enables the efficiency with which the solid state light source is cooled to be improved.

Moreover, by providing the walls, the surface area that is in contact with the liquid medium, that is, the heat transfer surface area is increased and an even greater amount of heat can be dissipated from the solid state light source to the liquid medium. As a result, the efficiency with which the solid state light source is cooled can be improved.

In order to achieve the above-described structure, preferably, on the flow path in a region where at least the solid state light source is located, there is provided a turbulent flow generating member that disturbs a flow of the liquid medium.

According to this structure, by providing a turbulent flow generating member, the flow of the liquid medium is converted to a turbulent flow, and the proportion of flow rate components in directions other than the main flow direction is increased. As a result, the heat transporting efficiency of the liquid medium is increased, and the cooling performance of the solid state light source is improved.

Moreover, by providing a turbulent flow generating member, the surface area that is in contact with the liquid medium is increased and an the amount of heat that can be dissipated from the solid state light source to the liquid medium can be increased. As a result, the efficiency with which the solid state light source is cooled can be improved.

In order to achieve the above-described structure, preferably, there is further provided a circulation portion that is coupled to the mounting unit, and that defines a circulation flow path of the liquid medium that is flowing in the flow path, a circulation member that causes the liquid medium to circulate, and a heat dissipation member that dissipates heat from the liquid medium, and the circulation member and the heat dissipation member are installed in the circulation portion.

According to this structure, the circulation member makes the liquid medium circulate between the mounting unit and the heat dissipation member, so that the solid state light source can be continuously cooled. That is, the liquid medium absorbs heat that is generated from the solid state light source in the mounting unit, and the liquid medium that has absorbed this heat then dissipates the absorbed heat to the outside via the heat dissipation member. The liquid medium then once again absorbs heat in the mounting unit. As a result, the solid state light source can be continuously cooled.

The projection display apparatus of the present invention includes: the above-described light source apparatus; an optical modulator that modulates light form the light source apparatus; and a projection device that projects light that has been modulated by the optical modulator, wherein the light source apparatus is the above-described light source apparatus of the present invention.

That is, as a result of the projection display apparatus of the present invention being provided with the above-described light source apparatus of the present invention, it is possible to reduce the size of the projection display apparatus and to also improve the brightness of a displayed image.

In order to achieve the above-described objects, the light source apparatus of the present invention includes: a solid state light source that emits light; a mounting unit that mounts the solid state light source; a liquid medium that absorbs heat generated in the solid state light source; a heat dissipation member that dissipates heat from the liquid medium; a circulation member that cause the liquid medium to circulate between the mounting unit and the heat dissipation member; and a circulation portion in which the mounting unit, the heat dissipation member, and the circulation member are installed, and which defines a circulation flow path in which the liquid medium flows, wherein a mounting unit flow path that defines a portion of the circulation flow path is provided in the mounting unit, and the mounting unit is removable from the circulation portion.

That is, in the light source apparatus of the present invention, because the mounting unit is removable from the circulation portion, it is possible to remove the mounting unit from the circulation portion and mount the solid state light source. Furthermore, the mounting of optical systems such as lenses can also be performed with the mounting unit removed from the circulation portion, so that the manufacture of the mounting unit is simplified. Furthermore, when the light source apparatus of the present invention is used in other apparatuses, for example, in display apparatuses such as projection display apparatuses, it is possible to assemble the mounting unit and the circulation portion separately in the display apparatus, and to thereafter join the mounting unit and the circulation portion, so that the manufacturing of the light source apparatus is completed. That is, by separately assembling the mounting unit and the circulation portion, the possibility of avoiding any interference with the display apparatus can be increased. In addition, if the power supply circuit of the display apparatus is connected to the solid state light source in the form of the mounting unit, then a work space can be ensured so that the task is made easier.

Moreover, because the mounting unit flow path, which is a part of the circulation flow path, is formed in the mounting unit, the solid state light source and the mounting unit flow path can be treated as a unit. For example, when a structure is formed in the mounting unit flow path that increases the heat exchange surface area in accordance with the amount of heat generated in the solid state light source, because the solid state light source and the mounting unit flow path are treated as a unit, even if this unit that is formed by the solid state light source and the mounting unit flow path is replaced, the cooling performance of the solid state light source can be maintained without any particular alterations needing to be made to other elements in the light source apparatus.

Moreover, the circulation member makes the liquid medium circulate between the mounting unit and the heat dissipation member, so that the solid state light source can be continuously cooled. That is, the liquid medium absorbs heat that is generated from the solid state light source in the mounting unit, and the liquid medium that has absorbed this heat then dissipates the absorbed heat to the outside via the heat dissipation member. The liquid medium then once again absorbs heat in the mounting unit. As a result, the solid state light source can be continuously cooled. The result of this is that the power that is input into the solid state light source can be increased, which enables the amount of light that can be emitted from the solid state light source to be increased.

Moreover, even if the surface area of the solid state light source is decreased and the etendue is lowered so that, additionally, a reduction in the size of the light source apparatus is achieved, because the amount of power that is input can be raised, a high level of luminance can still be maintained.

In order to achieve the above-described structure, preferably, the mounting unit and the circulation portion respectively include coupling members that couple the mounting unit and the circulation portion together.

According to this structure, when the mounting unit is being attached to the circulation portion, it can be attached by being coupled using the coupling members. When the mounting unit is removed from the circulation portion, it can be removed by decoupling the coupling members, so that installation and removal can be easily performed.

In order to achieve the above-described structure, more specifically, the heat dissipation member and the circulation member may respectively include a flow path that defines a portion of the circulation flow path, and coupling members that couple the heat dissipation member and the circulation member either together or to the circulation portion or to the mounting unit, and the heat dissipation member and the circulation member are respectively removable from the circulation portion.

According to this structure, because the heat dissipation member and the circulation member are each able to be separately installed in or removed from the circulation portion, it is also possible to easily avoid interference with the display apparatus from the heat dissipation member and circulation member as well, so that the ease of assembly can be improved.

Moreover, once they have been assembled in the display apparatus, the heat dissipation member and circulation member can be removed as individual units. Therefore, unlike when a plurality of devices are formed as a single unit, the heat dissipation member and the circulation member can be replaced individually, and the upkeep and maintenance of the light source apparatus can be easily accomplished.

Because it is possible to treat the heat dissipation member and the circulation member as individual components, by standardizing the shape of the coupling member, it becomes possible to use not only heat dissipation members and circulation members that have been specifically designed for this apparatus, but to also use other heat dissipation members and circulation members.

In order to achieve the above-described structure, more specifically, the circulation portion may also be divided into at least two sections, and a plurality of heat dissipation members may be installed in one section of the divided circulation portion, and the divided circulation portions may include coupling members that couple the divided circulation portions together.

In order to achieve the above-described structure, more specifically, the circulation portion may be divided into at least two sections, and a plurality of the circulation members may be installed in one section of the divided circulation portion, and the divided circulation portions may include coupling members that couple the divided circulation portions together.

In order to achieve the above-described structure, more specifically, the circulation portion may be divided into at least two sections, and at least one of the heat dissipation members and at least one of the circulation members may be provided in one section of the divided circulation portion, and the divided circulation portions may include coupling members that couple the divided circulation portions together.

According to this structure, because the circulation portion is divided into at least two portions, it is easy to avoid interference with the above-described display apparatus, and the ease with which the circulation portion is assembled in the display apparatus can be improved.

In addition, because a plurality of the above-described devices (i.e., a plurality of heat dissipation members; a plurality of circulation members; or one or more heat dissipation members and one or more circulation members) are provided in one of the divided circulation portions, it is possible to assemble a plurality of these devices in the display apparatus in a single operation. As a result, compared with when a heat dissipation member and circulation member are assembled individually, the number of operations needed to assemble these heat dissipation members and circulation members can be decreased.

In order to achieve the above-described structure, preferably, the circulation portion has flexibility.

According to this structure, when the light source apparatus of the present invention is being assembled in the above-described display apparatus, firstly, the mounting unit and the like are assembled in advance in the display apparatus, and subsequently, the circulation portion that has flexibility is assembled in the display apparatus. At this time, because the circulation portion has flexibility, it is easy to avoid interference between the circulation portion and the display apparatus. In addition, even if the circulation portion is one that is intertwined and meanders complicatedly, it can still be positioned easily, so that the light source apparatus can be easily assembled.

The projection display apparatus of the present invention includes: the above-described light source apparatus; an optical modulator that modulates light form the light source apparatus; and a projection device that projects light that has been modulated by the optical modulator.

As a result of the projection display apparatus of the present invention being provided with the above-described light source apparatus of the present invention, it is possible to reduce the size of the projection display apparatus and to also improve the brightness of a displayed image.

BRIEF DESCRIPTION THE DRAWINGS

FIG. 15 is a variant of the light source apparatus according to the first embodiment of the first aspect of the present invention;

FIG. 34 is a side view of the mounting unit of the light source apparatus according to the first embodiment of the second aspect of the present invention;

DETAILED DESCRIPTION OF THE INVENTION

First Aspect (Light Source Apparatus)

First Embodiment

The light source apparatus that is the first embodiment of the first aspect of the present invention will now be described with reference made to FIGS. 1 through 14.

Figure 1:
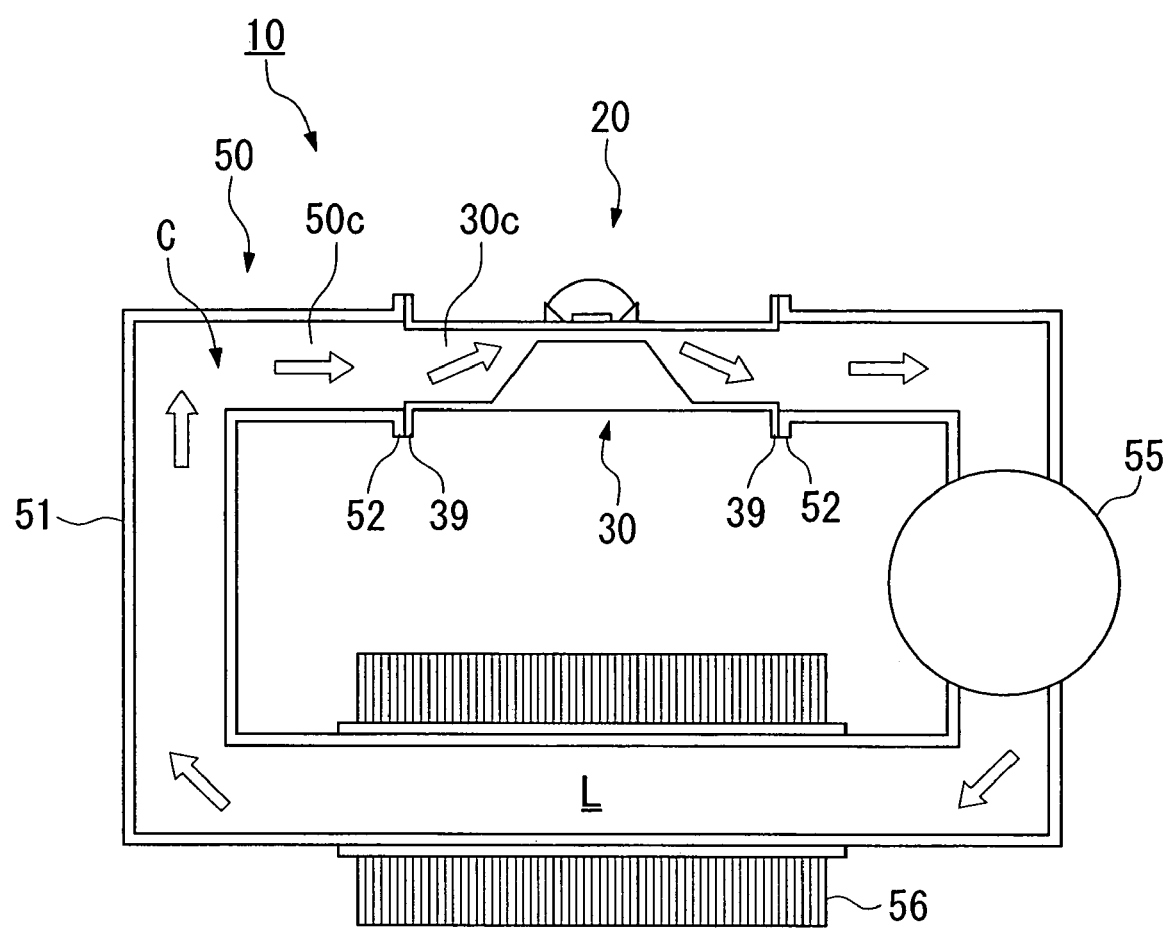
FIG. 1 is a schematic view of a light source apparatus according to the first embodiment of the first aspect of the present invention.

FIG. 1 is a schematic view of the light source apparatus according to the first aspect of the present invention.

As shown in FIG. 1, a light source apparatus 10 generally includes a light source unit 20 that emits light, a mounting unit 30 on which the light source unit 20 is mounted, a circulation portion 50 that is coupled to the mounting unit 30 and that, together with the mounting unit 30, defines a circulation flow path C along which a liquid (i.e., a liquid medium) L flows, a circulation pump (i.e., a circulation means) 55 that causes the liquid L to circulate, and a cooling fin (i.e., a heat dissipation means) 56 that cools the liquid L.

Figure 2:
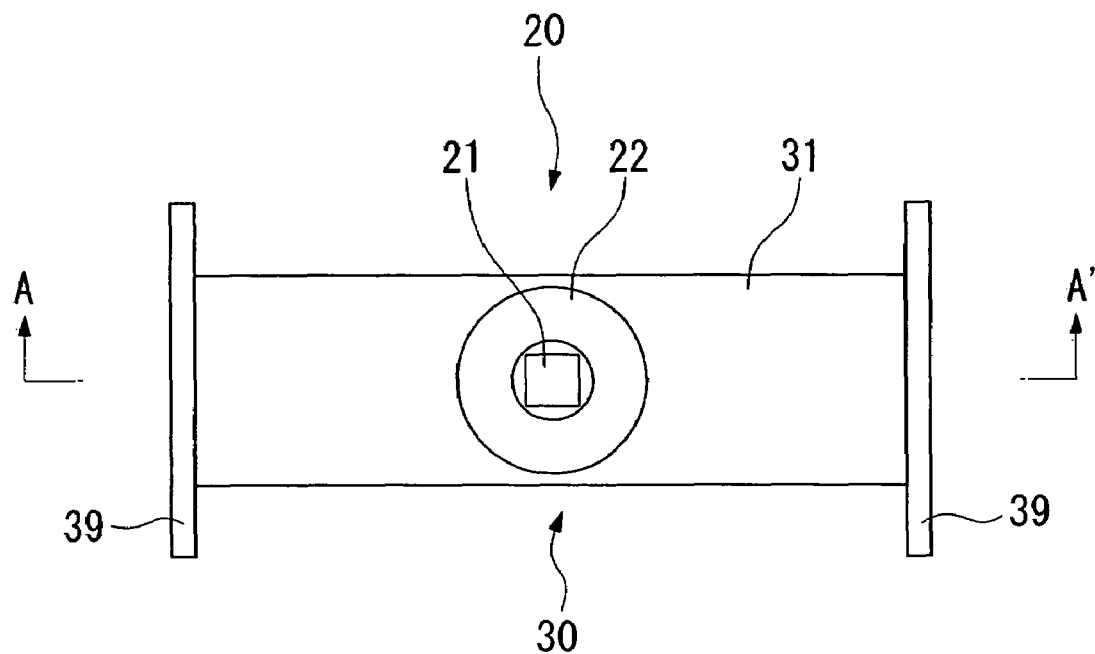
FIG. 2 is a plan view of a mounting unit of the light source apparatus according to the first embodiment of the first aspect of the present invention.
Figure 3:
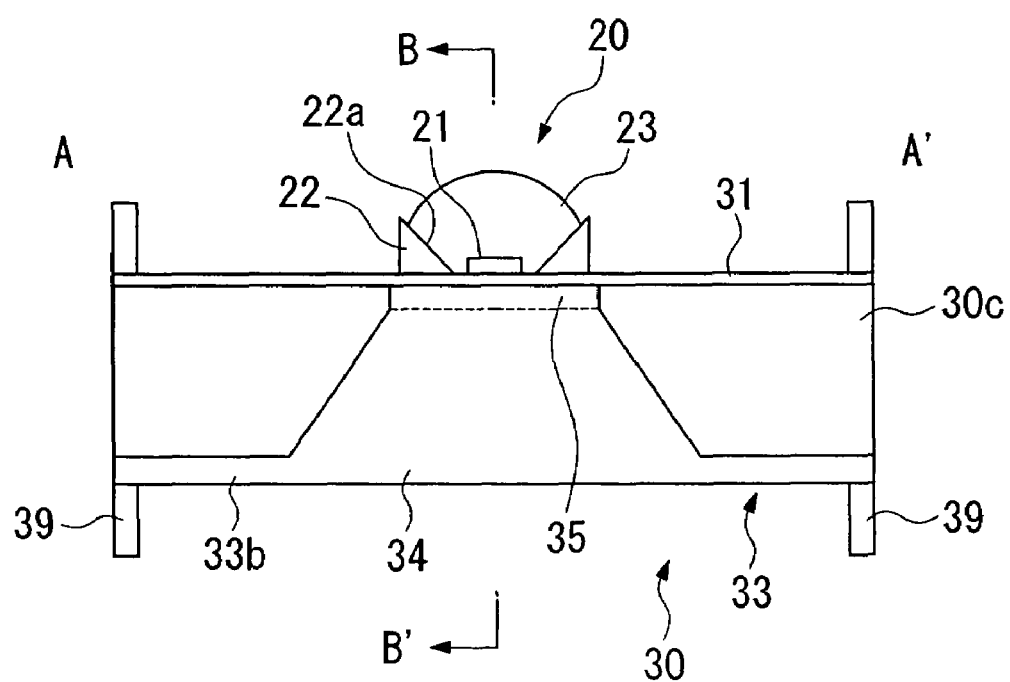
FIG. 3 is a cross-sectional view taken along a line A-A' in FIG. 2.
Figure 4:
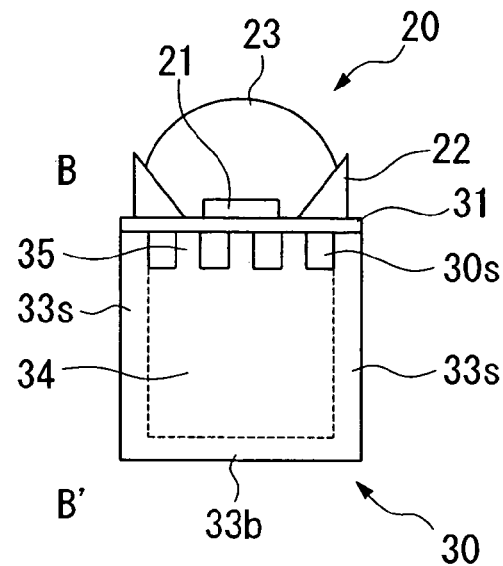
FIG. 4 is a cross-sectional view taken along a line B-B' in FIG. 3.

FIG. 2 is a plan view of a mounting unit of the light source apparatus. FIG. 3 is a cross-sectional view taken along a line A-A' in FIG. 2. FIG. 4 is a cross-sectional view taken along a line B-B' in FIG. 3.

As shown in FIGS. 2 through 4, the light source unit 20 has an LED chip (i.e., a solid state light source) 21 that emits light, a reflection unit 22 that reflects light that is emitted to the sides back to an illuminated area, and a lens 23 that gathers the emitted light towards the illuminated area, or converts it into parallel rays that are directed towards the illuminated area.

The LED chip 21 is placed so as to be in direct contact with substantially a center of a top of a placement plate 31 (described below). Power is supplied to the LED chip 21 from the placement plate 31 with which it is in direct contact, and from a terminal (not shown) that is insulated from the placement plate 31.

The reflection unit 22 is placed on the same plane as the LED chip 21 and has an annular shape, as seen in plan view, centered on the LED chip 21. A reflective surface 22a that is tilted to the illuminated area towards the outside is formed on a surface of the reflection unit 22 that faces the LED chip 21.

The lens 23 is placed on the reflection unit 22. A top portion of the lens 23 has a convex shape so as to gather light that is emitted from the LED chip 21 onto the illuminated area or to convert this light into parallel rays that are directed towards the illuminated area. The lens 23 is made of a material having optical characteristics of allowing light emitted from the LED chip 21 to pass through without any of this light being lost, and is formed, for example, from a transparent material such as glass, an acrylic resin, a polycarbonate, or the like.

Figure 5:
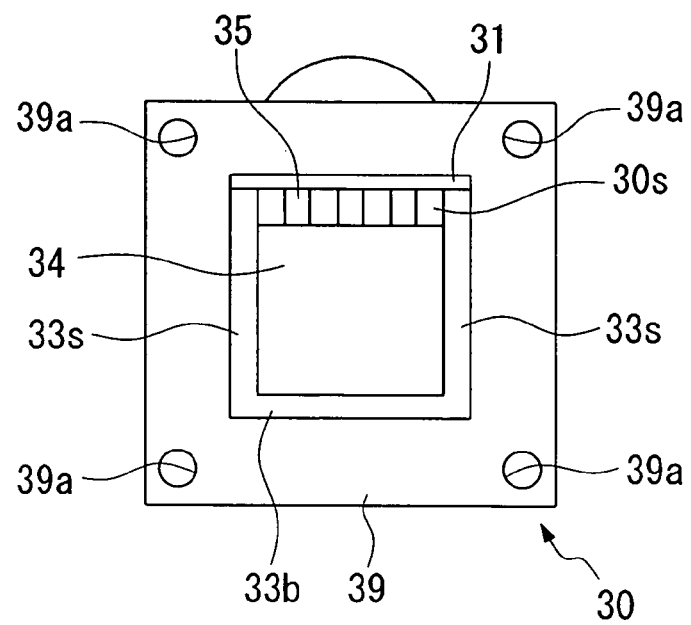
FIG. 5 is a side view of the mounting unit of the light source apparatus according to the first embodiment of the first aspect of the present invention.

FIG. 5 is a side view of a mounting unit of an optical source apparatus.

As shown in FIGS. 2 through 5, the mounting unit 30 has a placement plate (i.e., a placement member and electrode) 31 on which the light source unit 20 is mounted, a base 33 that together with the placement plate 31 defines a mounting unit flow path (i.e., a flow path) 30c, which is a portion of the circulation flow path C, and flanges 39 that are used in a coupling with the circulation portion 50 (described below).

The placement plate 31 is made of a material having a high thermal conductivity as well as electroconductivity such as metals, for example, Cu or Al, and is formed having the same shape as that of the base 33 when this is seen in plan view. The thickness of the placement plate 31 is smaller than the thickness of the side walls and bottom of the base 33.

Holes 39a that are used to insert engaging members such as bolts that are used when the flange 39 is coupled to the circulation portion 50 (described below) are defined in the flange 39.

Figure 6:
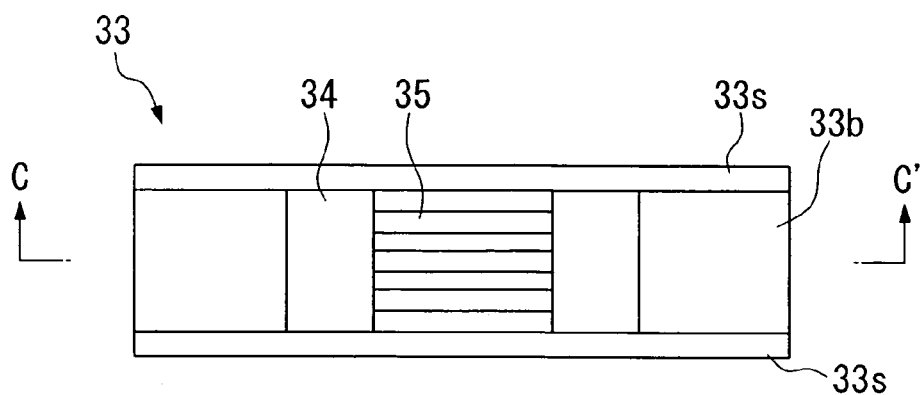
FIG. 6 is a plan view of a base of the mounting unit of the light source apparatus according to the first embodiment of the first aspect of the present invention.
Figure 7:
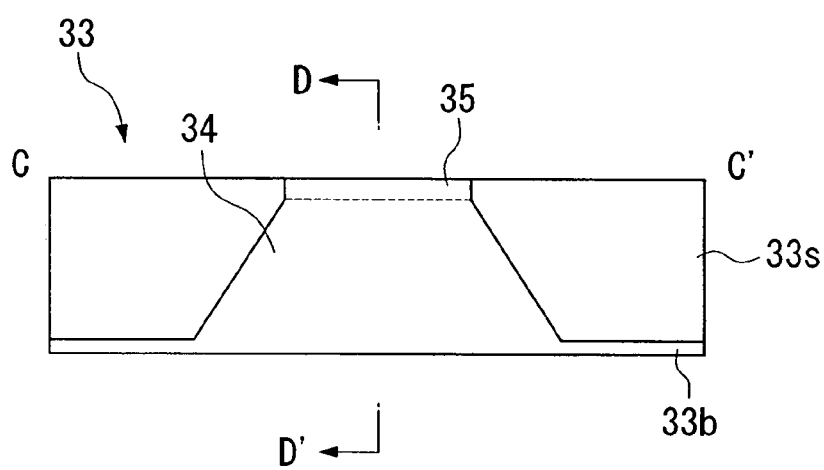
FIG. 7 is a cross-sectional view taken along a line C-C' in FIG. 6.

FIG. 6 is a plan view of the base of the mounting unit. FIG. 7 is a cross-sectional view taken along the line C-C' in FIG. 6, while FIG. 8 is a cross-sectional view taken along the line D-D' in FIG. 7.

Figure 8:
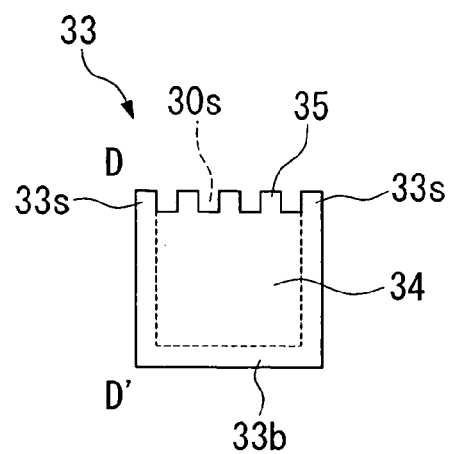
FIG. 8 is a cross-sectional view taken along a line D-D' in FIG. 7.
Figure 9:
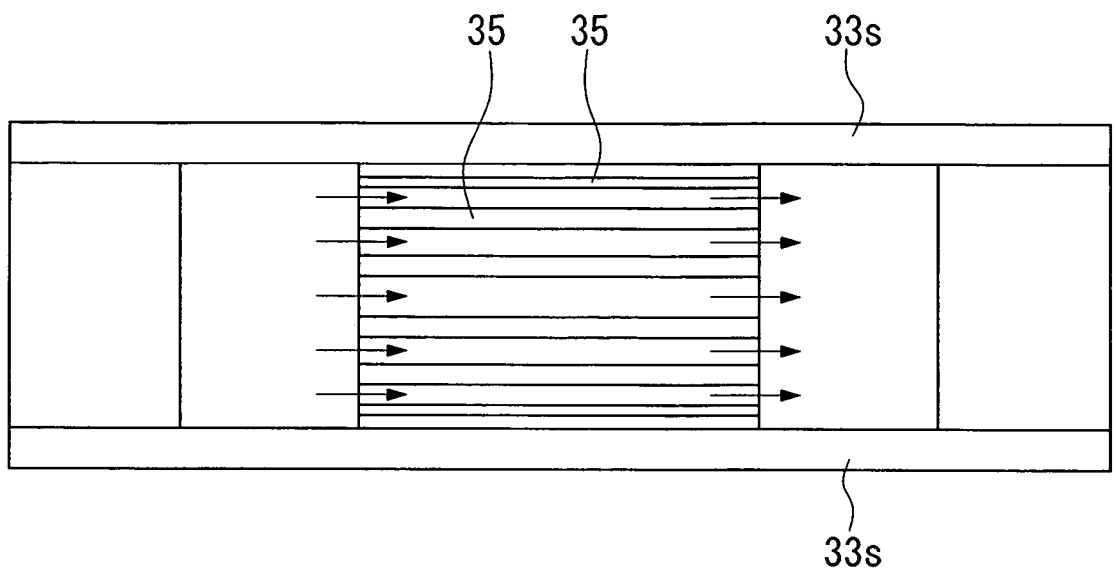
FIG. 9 is a plan view showing a variant of a base of the mounting unit of the light source apparatus according to the first embodiment of the first aspect of the present invention.

As shown in FIGS. 6 through 8, the base 33 is formed in a U shape that includes facing side walls 33s and a bottom 33b. A narrowed flow portion 34 having a trapezoid shape that becomes narrower towards the top is formed substantially in the center of the top surface of the bottom 33b and extending to the two side walls 33s. The height of the narrowed flow portion 34 is lower than that of the side walls 33s, and the mounting unit flow path 30c is also defined between the narrowed flow portion 34 and the placement plate 31. Three walls 35 that divide the mounting unit flow path 30c are placed equidistantly in a row and in parallel with the side walls 33s (i.e., in the transverse direction in FIG. 6) on a top surface of the narrowed flow portion 34. The walls 35 are formed such that upper ends thereof are at the same level as upper ends of the side walls 33s. As a result of the walls 35 being placed so as to be in contact with the placement plate 31, the mounting unit flow path 30c is divided into four narrow flow paths 30s that each have the same cross-sectional area (see FIGS. 4 and 5). Note that it is not necessary for the placement plate 31 to be in contact with the walls 35 and it is also possible, for example, for the top of the narrow flow paths 30s to be open.

FIGS. 9 through 12 are plan views showing alternative configurations of the base of the present embodiment.

Figure 10:
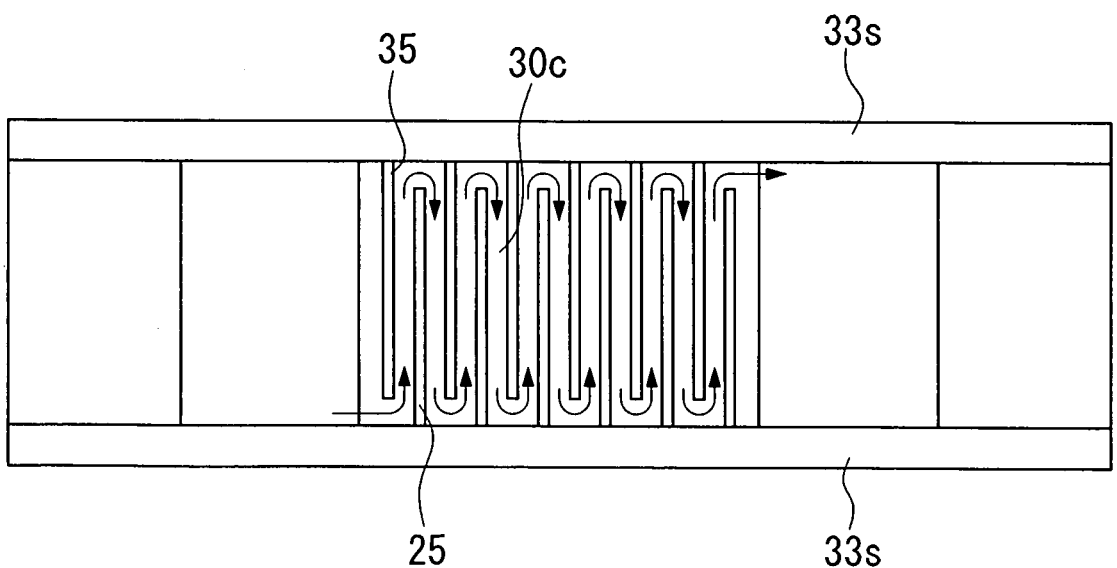
FIG. 10 is a plan view showing a variant of the base of the mounting unit of the light source apparatus according to the first embodiment of the first aspect of the present invention.
Figure 11:
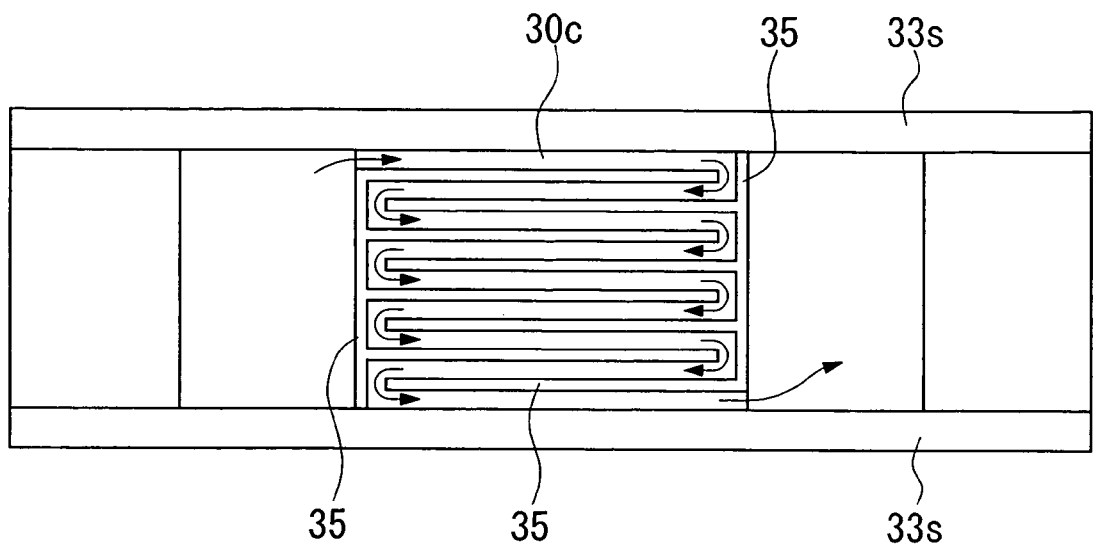
FIG. 11 is a plan view showing a variant of the base of the mounting unit of the light source apparatus according to the first embodiment of the first aspect of the present invention.
Figure 12:
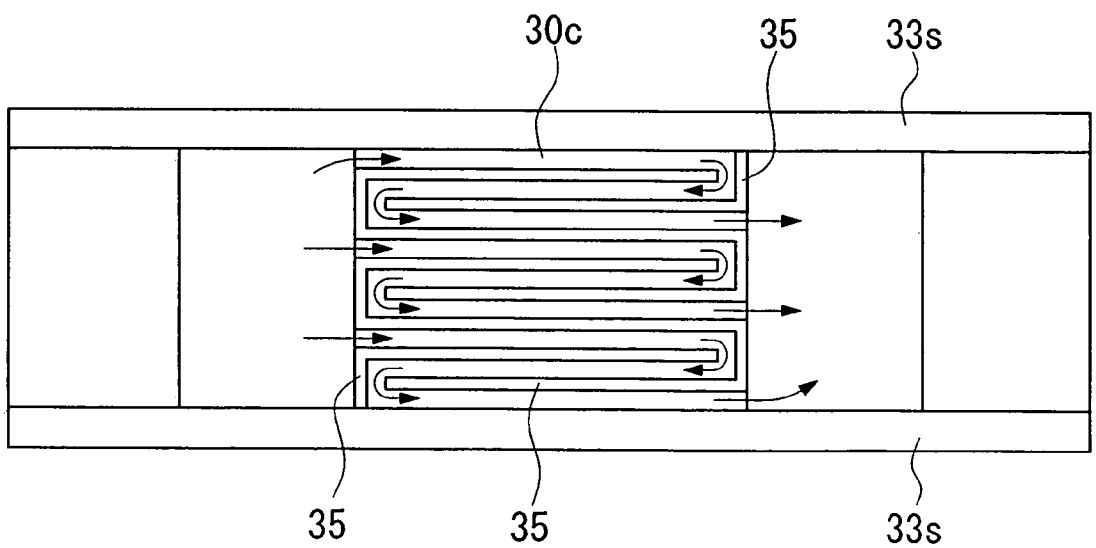
FIG. 12 is a plan view showing a variant of the base of the mounting unit of the light source apparatus according to the first embodiment of the first aspect of the present invention.

Note that the configuration and placement of the base 33 and the walls 35 may be selected so that the mounting unit flow path 30*c* are divided equidistantly in parallel, as described above, or as shown in FIG. 9, may be a configuration and placement in which the spacing between the walls 35 becomes narrower while the thickness of the walls 35 becomes smaller from the center towards the side walls 33*s* (i.e., towards the top and bottom in FIG. 9). In this case, it is possible to increase the flow rate of the liquid L in the center in which the LED chip 21 is placed, thereby improving the heat transport capability. In addition, as shown in FIG. 10, it is also possible for walls 35 to be placed extending alternately from one side wall 33*s* towards the opposite side wall 33*s* (i.e., in the vertical direction in FIG. 10), so that the narrow flow path 30*s* meanders in the short side direction. Moreover, it is also possible to place the walls 35 in the manner shown in FIG. 11, so that the narrow flow path 30*s* meanders in the longitudinal direction (i.e., to the left and right in FIG. 11). Alternatively, it is also possible to place the walls 35 in the manner shown in FIG. 12, so that a plurality of narrow flow paths 30*s* meander in the longitudinal direction (i.e., to the left and right in FIG. 12). In these cases, the placement enables the contact area between the walls 35 and the liquid L to be increased, and enables the amount of the heat transported from the LED chip 21 to the liquid L to be improved.

As shown in FIG. 1, the circulation portion 50 has a pipe shaped portion 51 in which a pipe shaped portion flow path 50*c* is defined, and flanges 52 that are provided at both ends of the pipe shaped portion 51 and that are used when the circulation portion 50 is coupled to the mounting unit 30.

A circulation pump 55 that causes the liquid L to circulate and a cooling fin 56 that cools the liquid L are placed in the pipe shaped portion 51. The pipe shaped portion 51 may be a member whose path cannot be changed such as a high-rigidity metal pipe or the like, or may be a member whose path can be changed freely such as a concertina shaped pipe.

Holes (not shown) that are used to insert engaging members such as bolts that are used when the flange 52 is coupled to the above-described mounting unit 30 are defined in the flange 52.

Note that the positional relationship between the circulation pump 55 and the cooling fin 56, as well as the direction of circulation of the liquid L may be those shown in FIG. 1, or may be different from the illustrated ones, and is not particularly limited.

The liquid L can be selected from liquids that are non-corrosive to the members forming the inner walls of the circulation flow path. More preferably, a liquid that has little vapor pressure, a low freezing point, excellent thermal stability, and a high thermal conductivity is desired. Examples of a liquid that can be used in the present invention include those that are typically used as organic liquid mediums such as biphenyldiphenylethers, alkylbenzenes, alkylbiphenyls, triaryldimethanes, alkylnaphthalenes, hydroterphenyls, and diarylalkanes. Silicone based and fluorine based liquids can also be used. The liquid may be selected from among these after further consideration is given to the applications of the light source apparatus, the required level of performance, environmental protection, and the like.

The cooling fin 56 is made of a metal such as, for example, Fe, Cu, Al, Mg, and the like, or by a material that includes these and has excellent thermal conductivity. As shown in FIG. 1, a plurality of fins are provided to the cooling fin 56 so as to increase the surface area thereof and improve the capacity of the fins to dissipate heat to the outside. In the present embodiment, the cooling fin 56 is secured using an appropriate means to a portion of the circulation portion 50 such that the thermal conduction from the circulation flow path C is not lost. It is also possible, however, to provide a plurality of cooling fins 56 in a plurality of locations. It is also possible for the cooling fin 56 to be formed separately from the circulation portion 50, or to be formed integrally with the circulation portion 50. Moreover, if the amount of heat that is dissipated by just the natural convection current of air flowing between the fins is insufficient, it is also possible to increase the heat dissipation capacity still further by forcibly creating an air convection current by providing an electric cooling fan on the outside.

Note that, in the present embodiment, a description is given of a structure in which a cooling fin 56 is provided in order to enhance cooling, however, depending on the application and the environment in which of the light source apparatus 10 is used, the present embodiment can also be applied to a structure in which the cooling fin 56 is not provided.

Next, a description will be given of a method for manufacturing the mounting unit 30.

FIGS. 13A to 13D and 14A to 14C are diagrams showing a process for manufacturing the mounting unit.

Figure 13A:
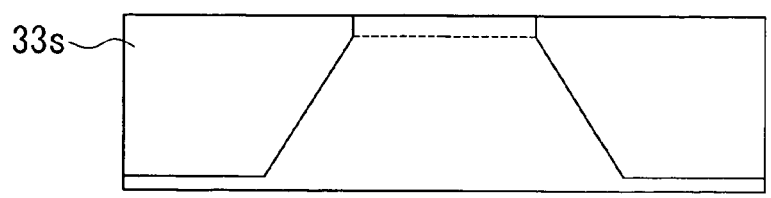
FIGS. 13A to 13D are diagrams showing a process for manufacturing the mounting unit of the light source apparatus according to the first embodiment of the first aspect of the present invention.
Figure 13B:
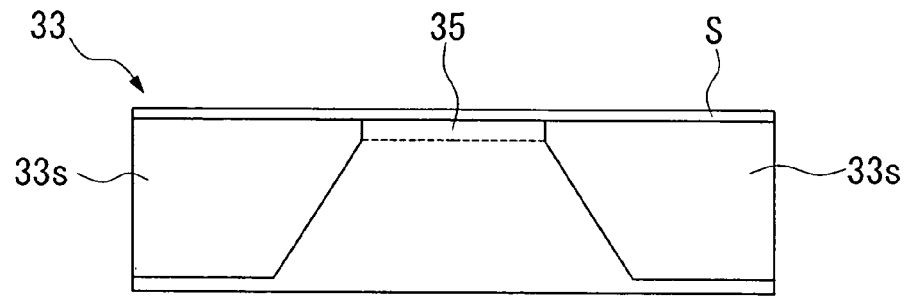

Firstly, as shown in FIG. 13A, the base 33 is fabricated using a known method such as molding, machining, or grinding. Next, as shown in FIG. 13B, solder S that is used for welding is placed on upper end surfaces of the side walls 33*s* and the walls 35.

Figure 13C:
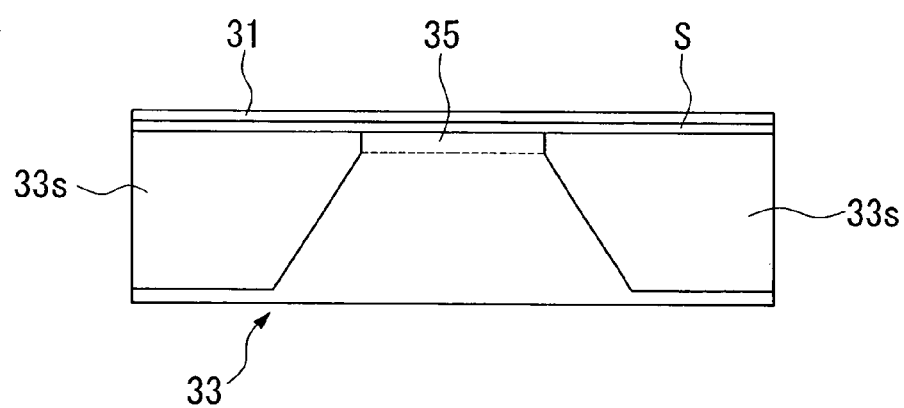
Figure 13D:
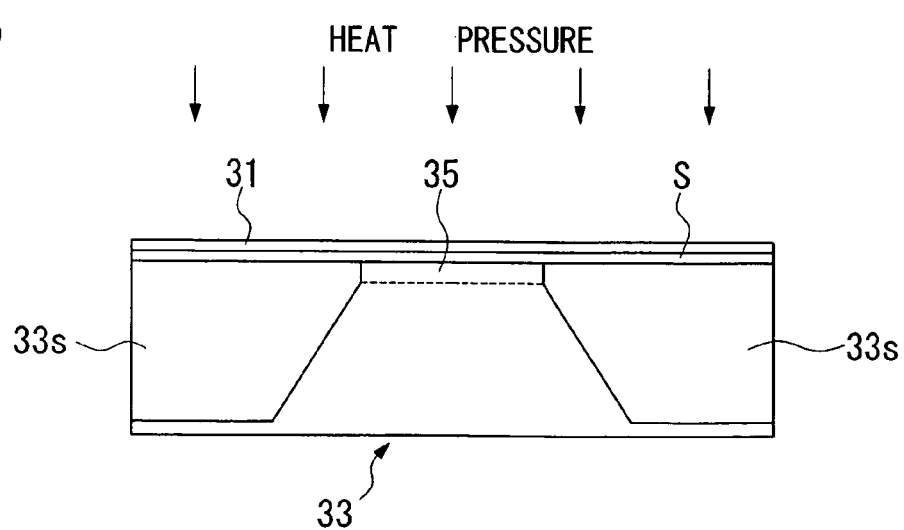
Figure 14A:
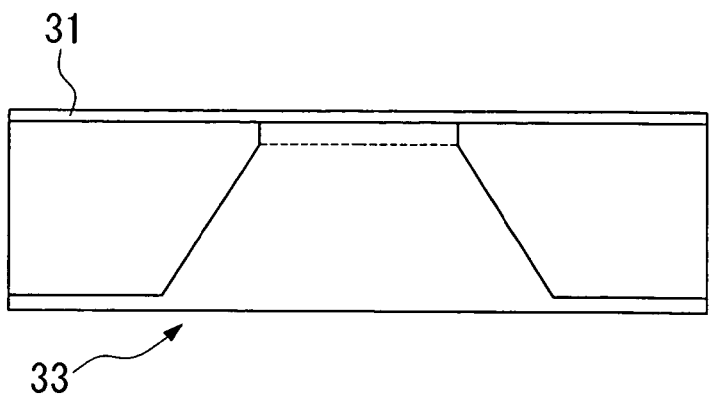
FIGS. 14A to 14C are diagrams showing a process for manufacturing the mounting unit of the light source apparatus according to the first embodiment of the first aspect of the present invention.

Next, as shown in FIG. 13C, the placement plate 31 is temporarily placed on top of the base 33 and, as shown in FIG. 13D, heat and pressure are applied from the placement plate 31 side so that the two are heat fused. Consequently, as shown in FIG. 14A, the placement plate 31 is weld to the base 33.

Figure 14B:
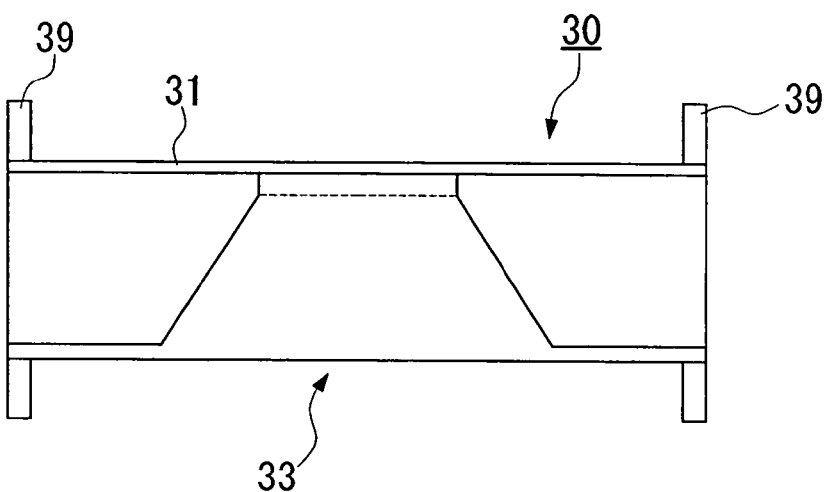
Figure 14C:
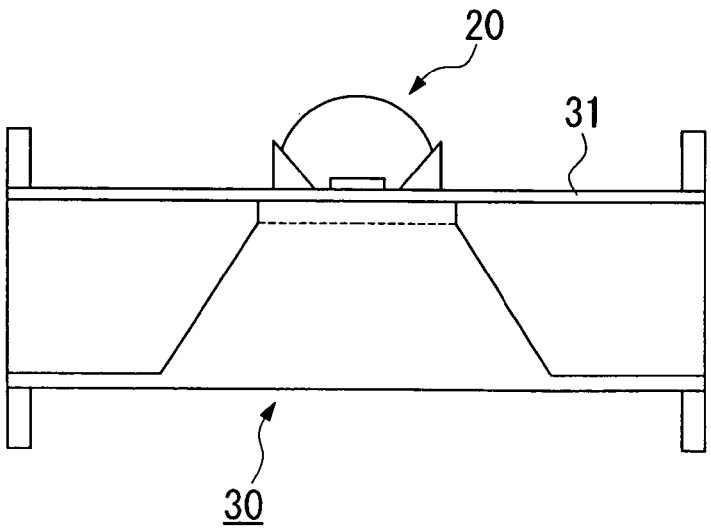

Next, as shown in FIG. 14B, the flanges 39 are placed on the two ends of the placement plate 31 and the base 33 and are fixed thereto using a known method such as bonding or welding. As a result, the manufacturing of the mounting unit 30 is completed. Through holes into which the placement plate 31 and the base 33 can be inserted are defined in the flanges 39, and one surface of the flanges 39 and the end portions of the placement plate 31 and the base 33 are placed so as to align each other. Thereafter, as shown in FIG. 14C, the light source unit 20 is placed on top of the placement plate 31.

Note that the mounting unit 30 can be manufactured using the above-described method, or may be manufactured using another method, and the manufacturing method is not particularly limited.

For example, the narrowed flow portion 34 may be formed separately from the base 33, and then welded to the base 33 by spot welding or the like. Note that if the narrowed flow portion 34 is formed as a separate member from the base 33, then the narrowed flow portion 34 may be made of a different material from the base 33, and, for example, other than metal, may be formed from resin or the like. By forming the narrowed flow portion 34 from resin or the like in this manner, it is possible to further reduce the cost of manufacturing the light source apparatus 10. Note that if the narrowed flow portion 34 is made of a resin or the like, then the narrowed flow portion 34 can be attached to the base 33 by an adhesive or the like. At this time, by forming a concave portion that corresponds to the shape of the narrowed flow portion 34 in advance in the base 33, the narrowed flow portion 34 can be aligned with ease.

It is also possible to form grooves in the placement plate 31 and to form the small flow passages 30s by connecting the surface in which these grooves are formed with the base whose top surface is level.

Next, an operation of the light source apparatus 10 that has the above-described structure will be described.

Firstly, an emission of light from the light source unit 20 will be described.

When power is supplied to the LED chip 21 from the placement plate 31 and the terminal, light is emitted from the LED chip 21 to surrounding portions. The light that has been emitted upwards is propagated through the lens 23 and is gathered towards the illuminated area or is converted into parallel rays that are directed towards the illuminated area and is then emitted.

Next, a description of the cooling of the light source unit 20 will be given.

The liquid L is circulated in the circulation flow path C by the circulation pump 55, and flows into the mounting unit flow path 30c. When the liquid L that has flowed into the mounting unit flow path 30c approaches the center of the mounting unit 30, the flow rate thereof quickens because the cross-sectional area of the flow path is decreased by the narrowed flow portion 34. When the liquid L then flows into the narrow flow paths 30s that are separated by the walls 35, the cross-sectional area of the flow path is decreased even further, so that the flow rate is increased even further. The flow of the liquid L that now has an increased flow rate changes from a laminar flow to a turbulent flow, and as a result of becoming a turbulent flow, there is an increased proportion of flow rate components in directions other than the main direction of the flow.

In the meantime, the heat that is generated in the LED chip 21 is transported to the placement plate 31, with which it is in direct contact, and to the walls 35 via the placement plate 31. As a result of the liquid L that now has a turbulent flow removing heat from the placement plate 31 and the walls 35, it cools the LED chip 21. Here, the liquid L that is in direct contact with the placement plate 31 and the walls 35 removes heat from the placement plate 31 and the walls 35. This liquid L that has removed the heat is stirred into the flow of the liquid L due to the flow rate components in directions other than the main direction of flow, while conversely the liquid L that has not absorbed heat is carried to the vicinity of the placement plate 31 and the walls 35, and removes heat from the placement plate 31 and the walls 35.

The liquid L that has removed the heat and consequently has a raised temperature flows out from the narrow flow paths 30s and the narrowed flow portion 34. The flow rate thereof slows, and the liquid L flows from the mounting unit flow path 30c into the circulation portion flow path 50c. The liquid L that has flowed into the circulation portion flow path 50c flows into the circulation pump 55 where it is pressurized and sent under pressure towards the cooling fin 56. The heat from the liquid L that has flowed into the area where the cooling fin 56 is placed is transported to the cooling fin 56 via the pipe shaped portion 51. The heat that has been transported to the cooling fin 56 is dissipated to the outside, for example, into the air, and the liquid L is cooled. The cooled liquid L is once again introduced into the mounting unit flow path 30c where it cools the LED chip 21.

According to the above-described structure, because the placement plate 31 that is interposed between the LED chip 21 and the liquid L is made of a metal having a high thermal conductivity such as, for example, Cu or Al, the heat generated in the LED chip 21 can be efficiently dissipated to the liquid L. At the same time, because the placement plate 31 has a small thickness, the heat generated in the LED chip 21 can be dissipated to the liquid L even more efficiently, and it is possible to efficiently cool the LED chip 21. As a result, it is possible to increase the power that is input into the LED chip 21, so that it is possible to increase the amount of light that can be emitted from the LED chip 21, thereby enabling an increase in luminance to be achieved. Moreover, because the input power can be increased even if the surface area of the LED chip 21 is reduced so that a lowering of the etendue and a reduction in the size of the light source apparatus are achieved, it is possible to maintain this high level of luminance.

Because the placement plate 31 also functions as one of the electrodes that supplies power to the LED chip 21, the LED chip 21 can be placed in direct contact with the placement plate 31, enabling the gap between the LED chip 21 and the placement plate 31 to be narrowed to the extent of the thickness of one electrode. As a result, the heat generated by the LED chip 21 can be more easily dissipated to the liquid L, enabling the LED chip 21 to be cooled more easily.

Because the cross-sectional area of the mounting unit flow path 30 is narrowed by the narrowed flow portion 34 and the walls 35, it is possible to increase the flow rate of the liquid L that flows through this area, and change it to a turbulent flow. As described above, because a turbulent flow has a greater heat transport capacity than a laminar flow, heat can be efficiently removed from the LED chip 21.

Moreover, even if the flow of the liquid L remains a laminar flow, if the flow rate thereof is increased (i.e., if the flow quantity is increased), the heat transport capacity of the liquid medium is improved and the efficiency with which the LED chip 21 is cooled can be improved.

By placing the walls 35 in the mounting unit flow path 30c, the contact surface area between the LED chip 21 and the liquid L as regards heat transfer, that is, the heat transfer surface area can be increased, and a greater amount of heat can be dissipated to the liquid L from the LED chip 21, enabling the efficiency with which the LED chip 21 is cooled to be improved.

The liquid L is circulated between the mounting unit 30 and the cooling fin 56 by the circulation portion 50 and the circulation pump 55 enabling the LED chip 21 to be continuously cooled. That is, the liquid L absorbs heat that is generated from the LED chip 21 in the mounting unit 30, and the liquid L that has absorbed this heat then dissipates the absorbed heat to the outside via the cooling fin 56. The liquid L then once again absorbs heat in the mounting unit 30. As a result of this, the LED chip 21 can be continuously cooled.

By bonding the placement plate 31 to the base 33 by welding, the bond strength between the placement plate 31 and the base 33 can be increased, the pressure of the liquid L can be raised, and the flow quantity and flow rate of the liquid L that is flowing along the mounting unit flow path 30c can be increased. If the flow quantity and flow rate of the liquid L are increased, then the quantity of heat that can be removed from the LED chip 21 can be increased, and it is possible to cool the LED chip 21 more efficiently.

FIGS. 15 through 19 show alternative configurations of the light source apparatus 10 of the present embodiment.

For example, in the alternative configuration shown in FIG. 15, the thickness between the outer surface of the placement plate 31 and the mounting unit flow path 30c is reduced only in the location where the LED chip (i.e., solid-state light source) 21 is mounted. The reason for employing such a structure is that, because the thickness of the placement plate 31 in the locations where the LED chip 21 is not mounted is increased in a relative manner, the thermal capacity of the areas of the placement plate 31 that surround the area where the LED chip 21 is mounted is greater, and it is possible to achieve a greater diffusion of heat to the surrounding areas. Accordingly, the LED chip 21 can be cooled more efficiently. Moreover, if the narrowed flow portion 34 is formed and the flow rate of the liquid L is increased, the pressure that is applied to the placement plate 31 can also be increased accordingly. Therefore, as described above, by making the thickness of the locations where the LED chip 21 is not mounted thicker in a relative manner, the rigidity of the placement plate 31 is improved. As a result, it is possible to prevent the placement plate 31 from becoming damaged even if the pressure that is applied to the placement plate 31 is increased.

Figure 16A:
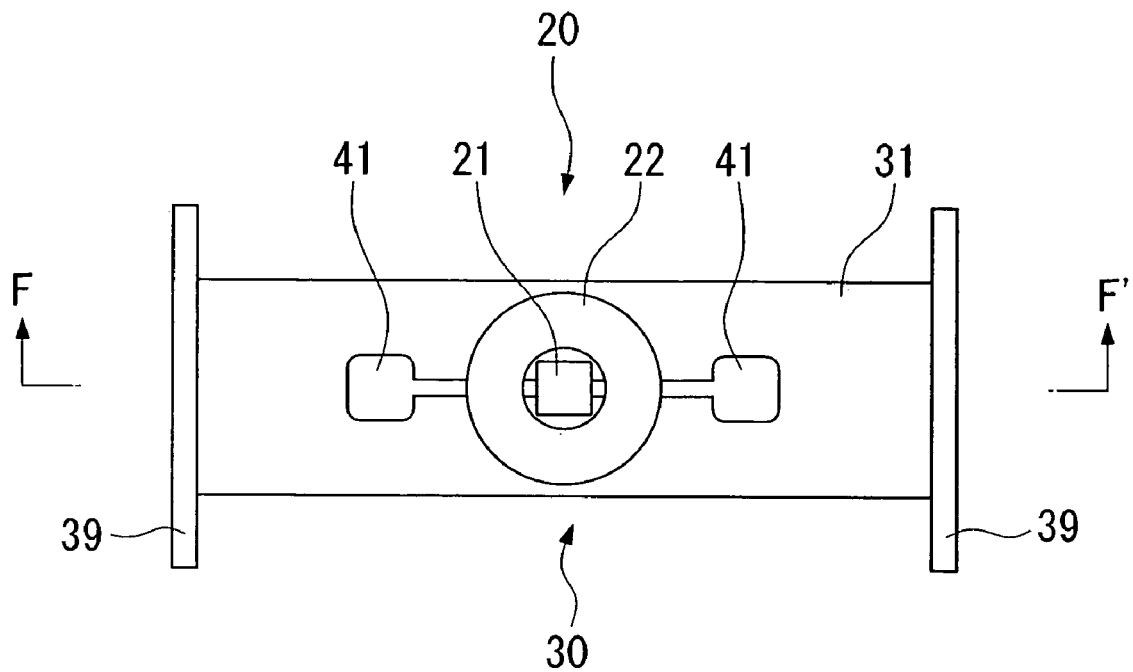
FIG. 16A is a variant of the light source apparatus according to the first embodiment of the first aspect of the present invention.
Figure 16B:
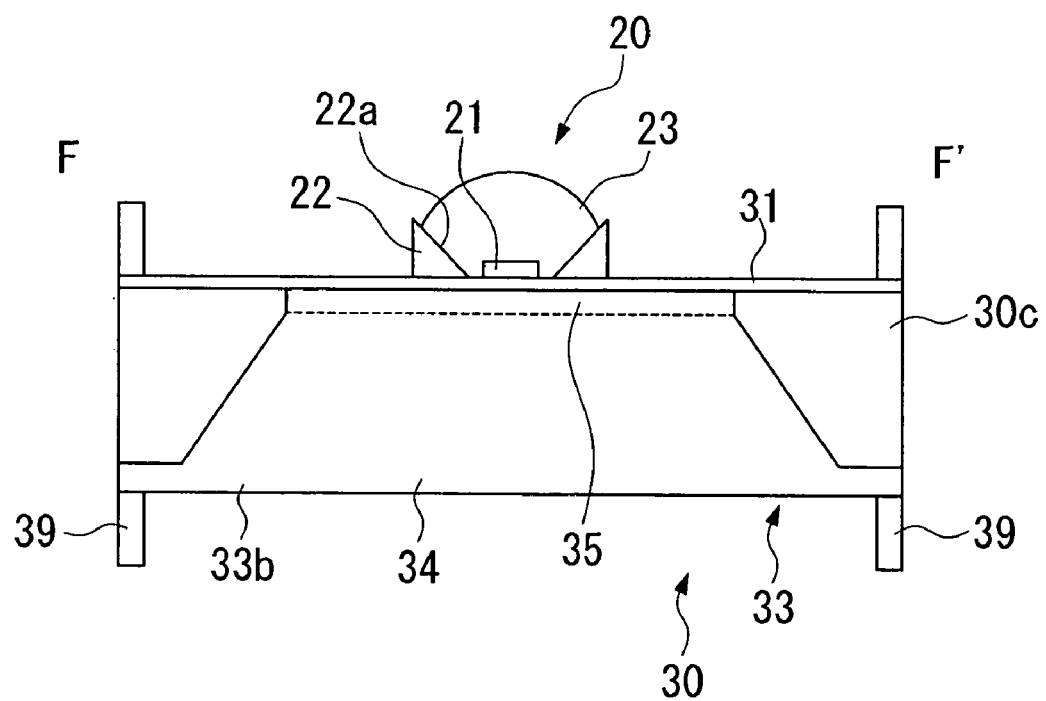
FIG. 16B is a cross-sectional view taken along a line F-F' in FIG. 16.

In the alternative configuration shown in FIG. 16A and 16B, the narrowed flow portion 34 is formed so as to correspond to an area that includes the locations where the LED chip (i.e., solid-state light source) 21 is mounted, and an area where a power supply pad 41 that is used to supply power to the light source apparatus 10 is formed. For example, if the power supply pad is formed by a fine metal wire, the power supply pad 41 itself generates heat when a large current is supplied. Consequently, there is a concern that the power supply pad 41 will melt and break. Therefore, as in the present embodiment, by narrowing the cross-sectional area of the mounting unit flow path 30c that corresponds to the area where the power supply pad 41 is formed, it is possible to efficiently transmit the heat from the power supply pad 41 to the liquid L. Accordingly, it is possible to prevent the temperature of the power supply pad 41 from rising, and to prevent the wires of the power supply pad 41 from breaking.

Figure 17A:
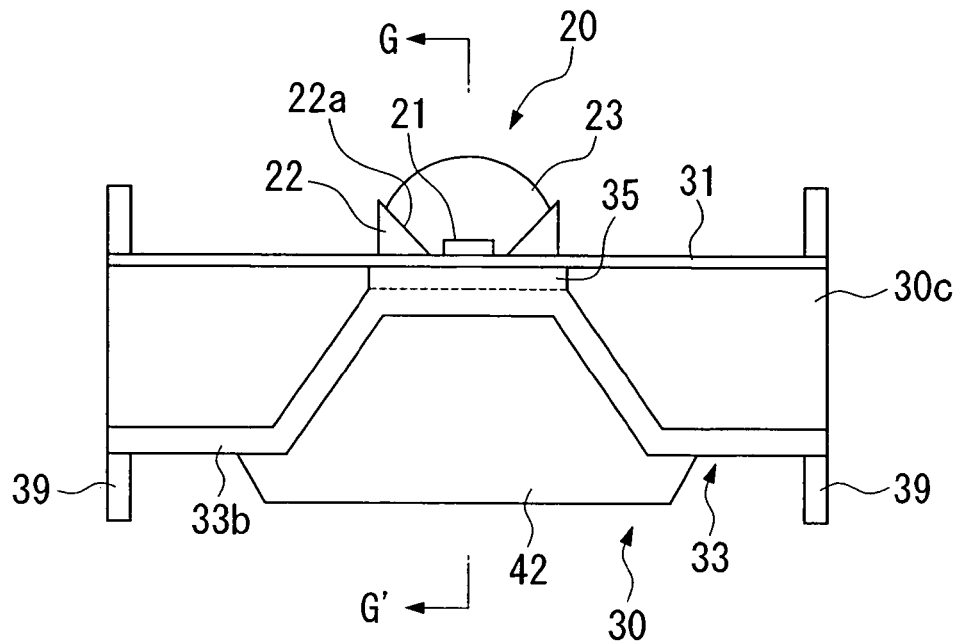
FIG. 17A is a variant of the light source apparatus according to the first embodiment of the first aspect of the present invention.
Figure 17B:
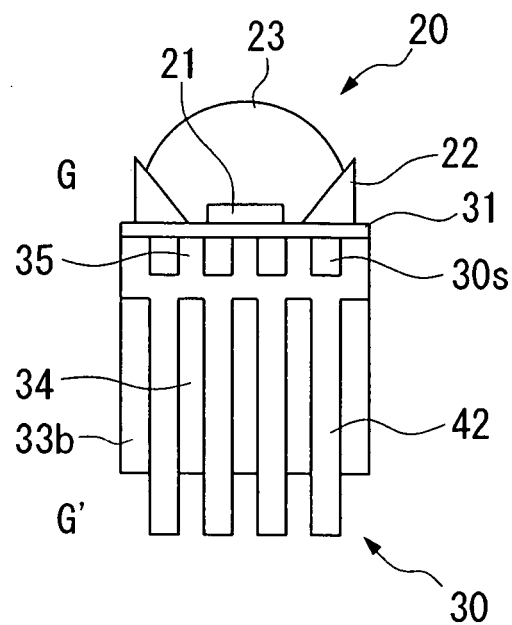
FIG. 17B is a cross-sectional view taken along a line G-G' in FIG. 16A.

In the alternative configuration shown in FIGS. 17A and 17B, the interior of the narrowed flow portion 34 is hollowed out, and a plurality of cooling fins 42 are further formed in the hollowed out location. For example, if the temperature of the liquid L is higher than that of the surrounding air, the heat dissipation area is increased by providing this type of cooling fins 42, and it becomes possible to efficiently dissipate the heat of the liquid L via the base 30. Consequently, the cooling efficiency of the light source apparatus 10 can be improved. If, on the other hand, the temperature of the liquid L is lower than that of the outside air, then by forming the base 30 with a sufficient thickness so that it becomes difficult for heat from the outside to be transmitted via the base to the liquid L, the cold preservation effect of the liquid L can be increased, and it is possible to more efficiently cool the light source apparatus 10.

Figure 18:
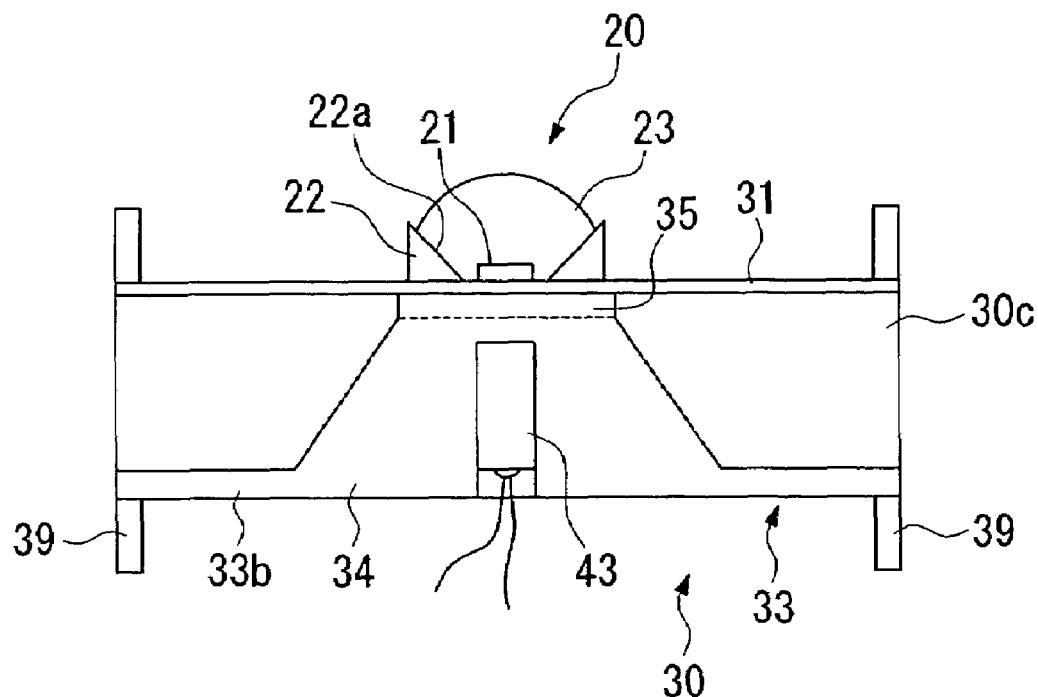
FIG. 18 is a variant of the light source apparatus according to the first embodiment of the first aspect of the present invention.
Figure 19:
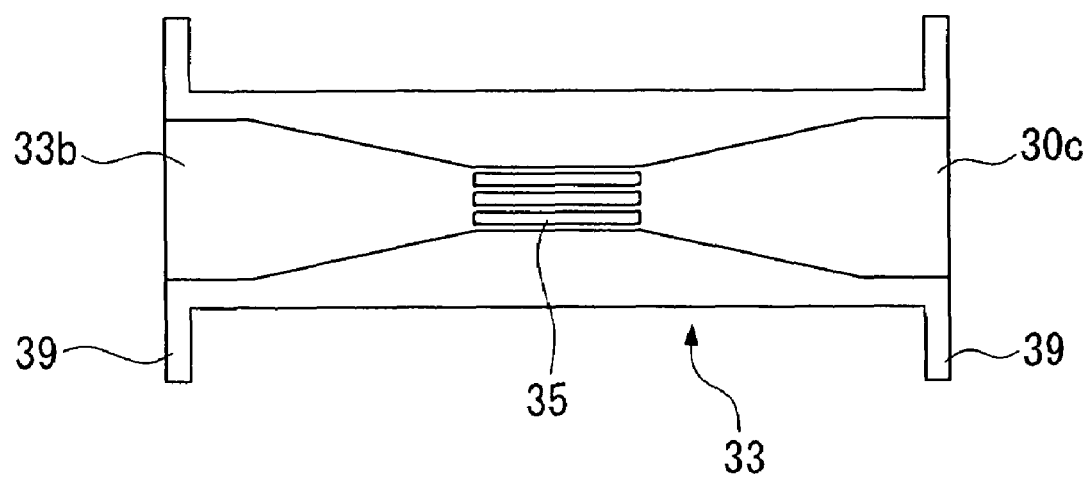
FIG. 19 is a variant of the light source apparatus according to the first embodiment of the first aspect of the present invention.

In the alternative configuration shown in FIG. 18, a temperature sensor 43 is placed inside the narrowed flow portion 34. By providing the temperature sensor 43 in the narrowed flow portion 34 in this manner, it becomes possible to measure the temperature of the LED chip 21 in the vicinity of the LED chip 21. As a result, it becomes possible to accurately measure the temperature of the LED chip 21, and it is no longer necessary to preserve a space in order to install the temperature sensor 43, so that the temperature sensor 43 can be installed without the size of the light source apparatus 10 having to be increased. Note that the results of the measurement by the temperature sensor 43 may be used as feedback for the amount of power that is supplied to the LED chip 21, or may be used as feedback for the circulation pump 55 and used to control the flow rate of the liquid L.

Note that, in the present embodiment, the flow rate of the liquid L is increased by narrowing the cross-sectional area of the mounting unit flow path 30c in an area where the LED chip 21 is placed. However, as shown, for example, in the plan view shown in FIG. 19, it is also possible to narrow the mounting unit flow path 30c in the transverse direction, and to thereby increase the flow rate of the liquid L.

Second Embodiment

Next, the second embodiment of the first aspect of the present invention will be described with reference made to FIG. 20 through FIG. 27.

The basic structure of the light source apparatus of the present embodiment is the same as that of the first embodiment, however, the structure of the mounting unit is different from that of the first embodiment. Accordingly, in the present embodiment, a description is only given of the area surrounding the mounting unit using FIGS. 20 and 27, and a description of the circulation portion and the like is omitted.

Figure 20:
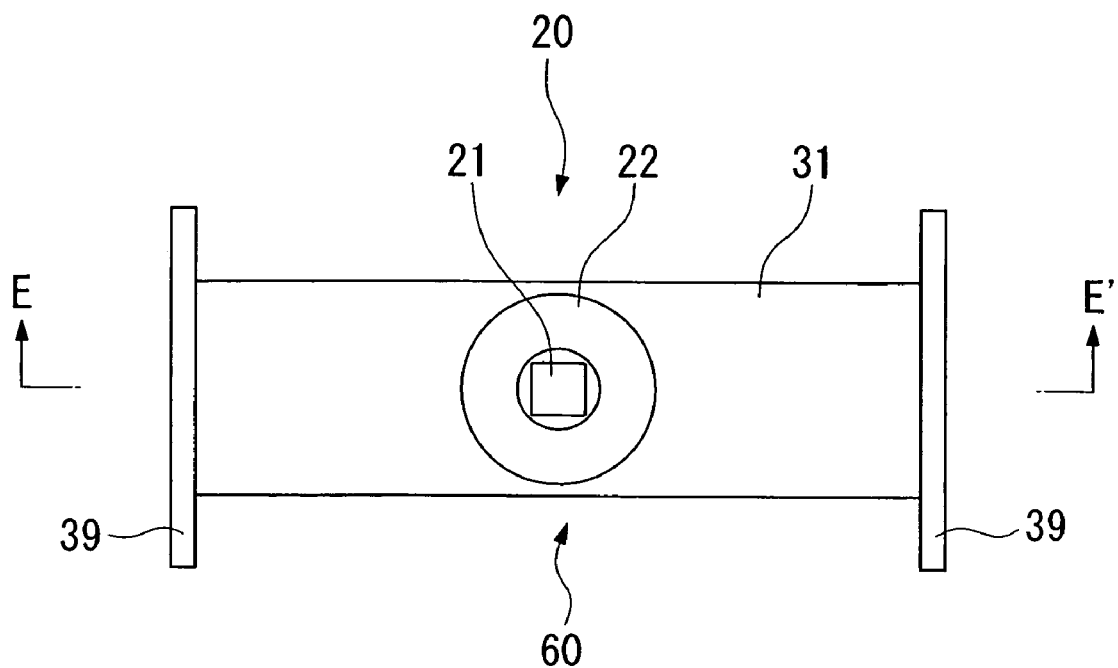
FIG. 20 is a plan view of a mounting unit according to a second embodiment of the first aspect of the present invention.
Figure 21:
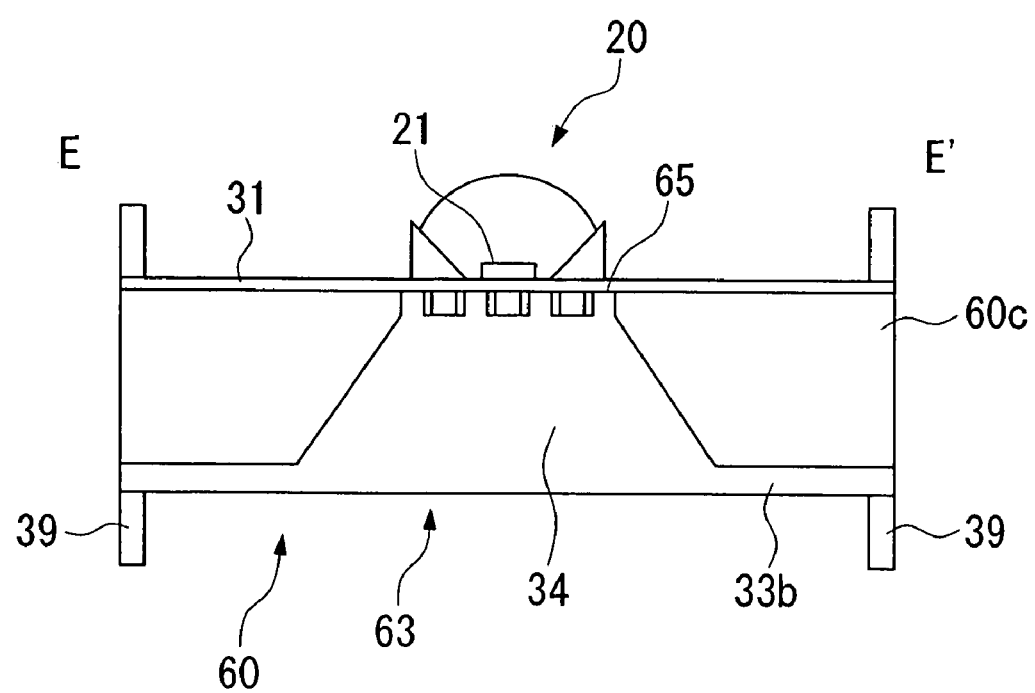
FIG. 21 is a cross-sectional view taken along a line E-E' in FIG. 20.
Figure 22:
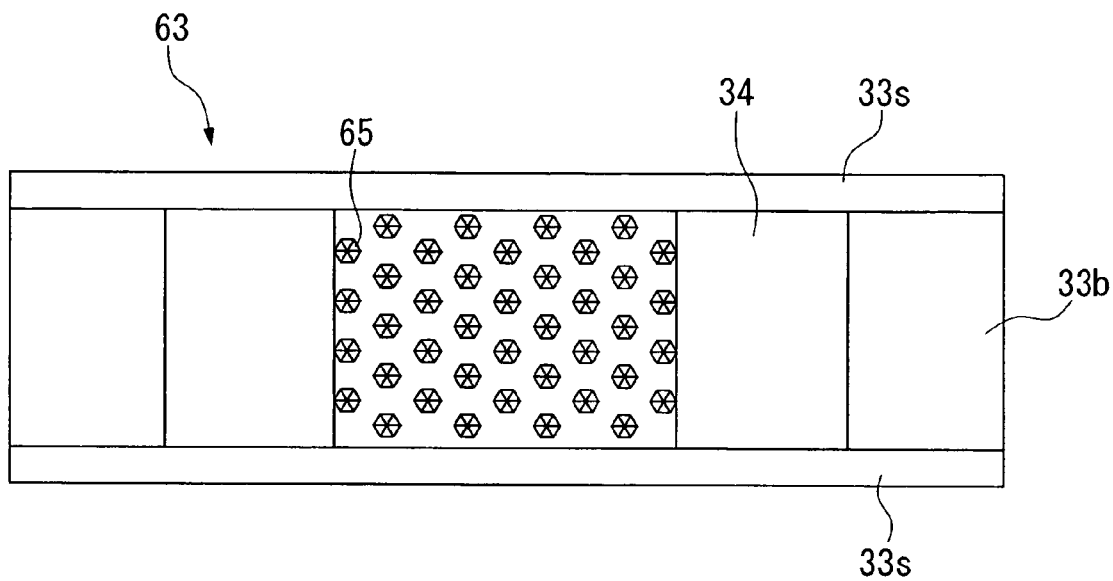
FIG. 22 is a plan view of a base of the mounting unit of the light source apparatus according to the second embodiment of the first aspect of the present invention.
Figure 23:
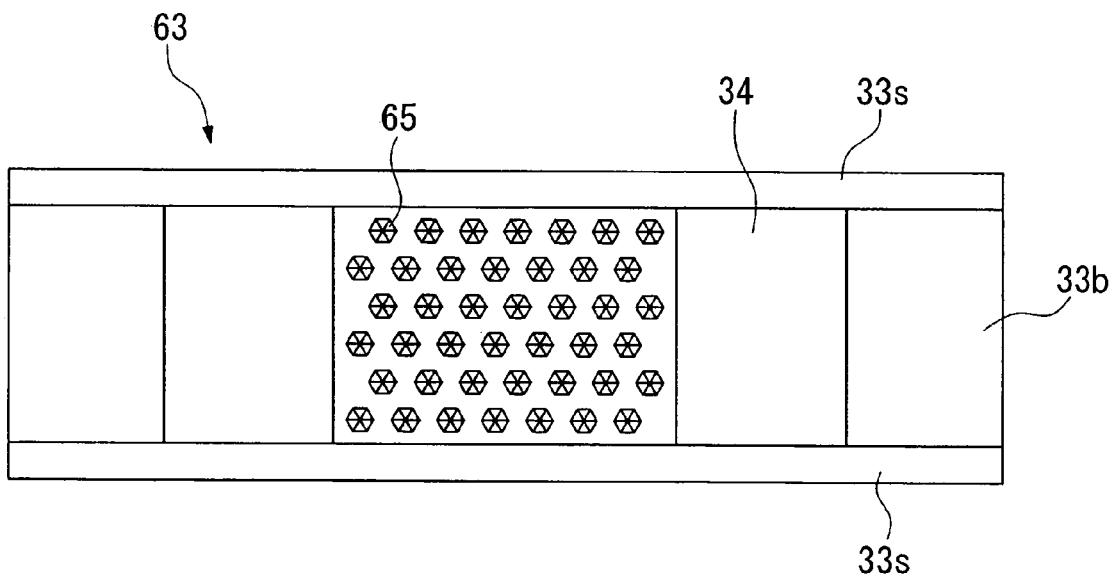
FIG. 23 is a plan view showing a variant of the base of the mounting unit of the light source apparatus according to the second embodiment of the first aspect of the present invention.

FIG. 20 is a plan view of a mounting unit of the present embodiment, FIG. 21 is a cross-sectional view taken along a line E-E' in FIG. 20. FIG. 22 is a plan view of a base of the mounting unit of the present embodiment.

As shown in FIG. 20 and FIG. 21, a mounting unit 60 has a placement plate 31 on which the light source unit 20 is mounted, a base 63 that together with the placement plate 31 defines a mounting unit flow path (i.e., a flow path) 60c, which is a portion of the circulation flow path, and flanges 39 that are used in a coupling with the circulation portion.

As shown in FIGS. 20 through 22, the base 63 is formed in a U shape that includes facing side walls 33s and a bottom 33b. A narrowed flow portion 34 having a trapezoid shape that becomes narrower towards the top is formed substantially in the center of the top surface of the bottom 33b. The height of the narrowed flow portion 34 is lower than that of the side walls 33s, and the mounting unit flow path 60c is also defined between the narrowed flow portion 34 and the placement plate 31.

As shown in FIG. 22, a plurality of hexagonal column shaped columns (i.e., a turbulent flow means) 65 are placed standing upright (i.e., protruding vertically upwards towards a person viewing FIG. 22) on a top surface of the narrowed flow portion 34. The upper end surfaces of the columns 65 are formed so as to be at the same plane as upper ends of the side walls 33s.

The columns 65 are arranged in substantially equidistant rows on substantially vertical straight lines relative to the side walls 33s (i.e., in the vertical direction in FIG. 22). In addition, these rows of columns 65 are arranged in equidistant rows in the main flow direction of the liquid L (i.e., in the left-right direction in FIG. 22). Furthermore, columns 65 in adjacent rows are arranged in a staggered configuration so as not to be arranged in single row in the main flow direction.

FIGS. 23 through 27 are plan views showing alternative configurations of the base of the present embodiment.

Figure 24:
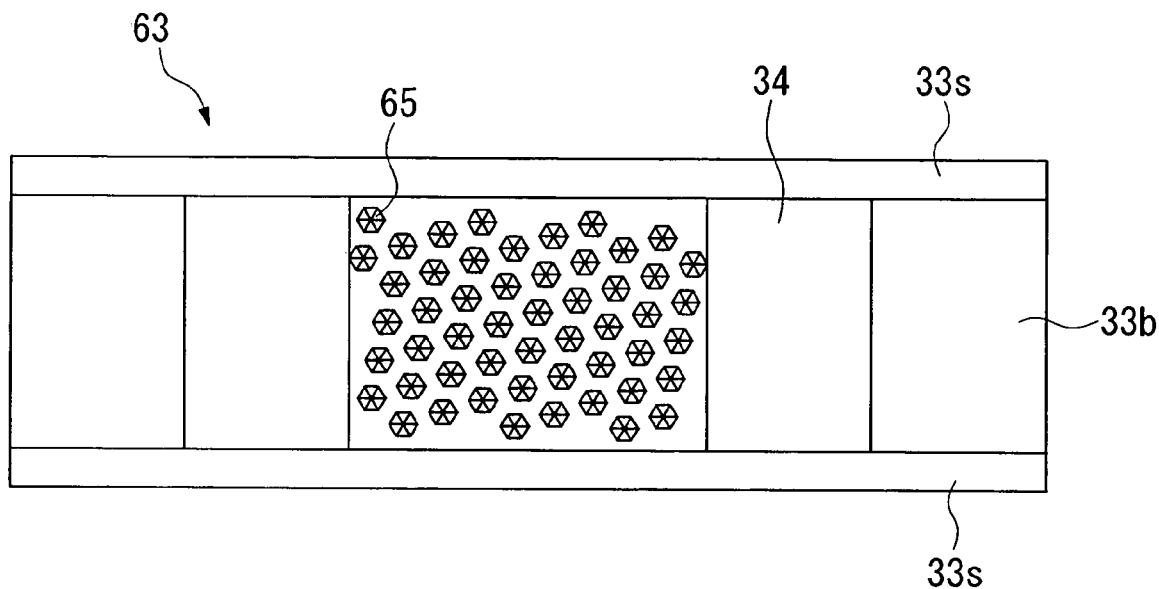
FIG. 24 is a plan view showing a variant of the base of the mounting unit of the light source apparatus according to the second embodiment of the first aspect of the present invention.
Figure 25:
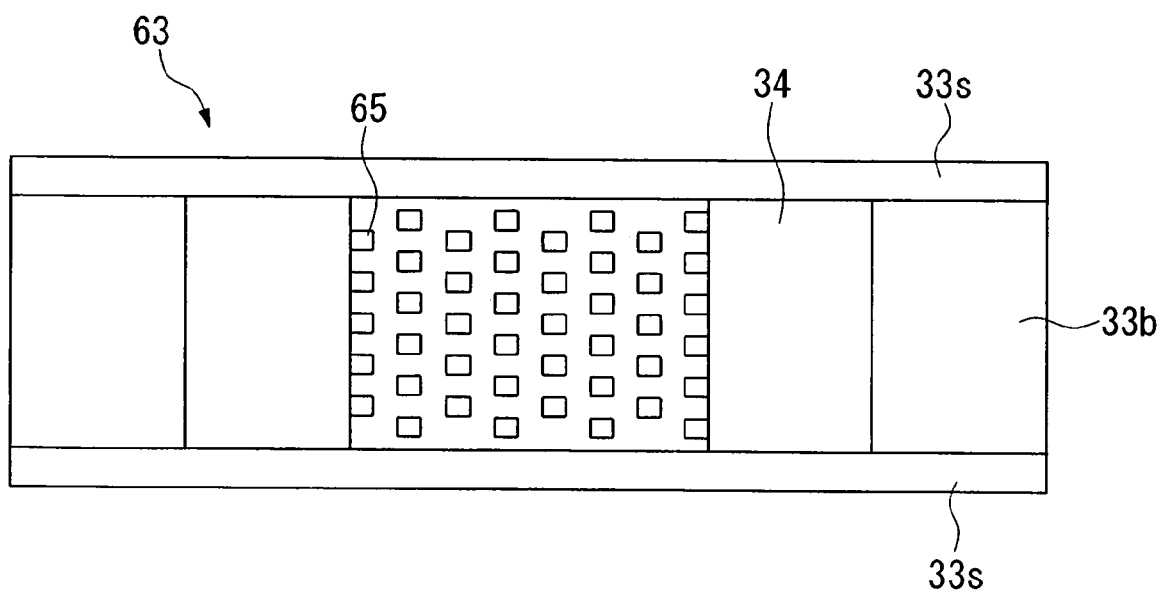
FIG. 25 is a plan view showing a variant of the base of the mounting unit of the light source apparatus according to the second embodiment of the first aspect of the present invention.
Figure 26:
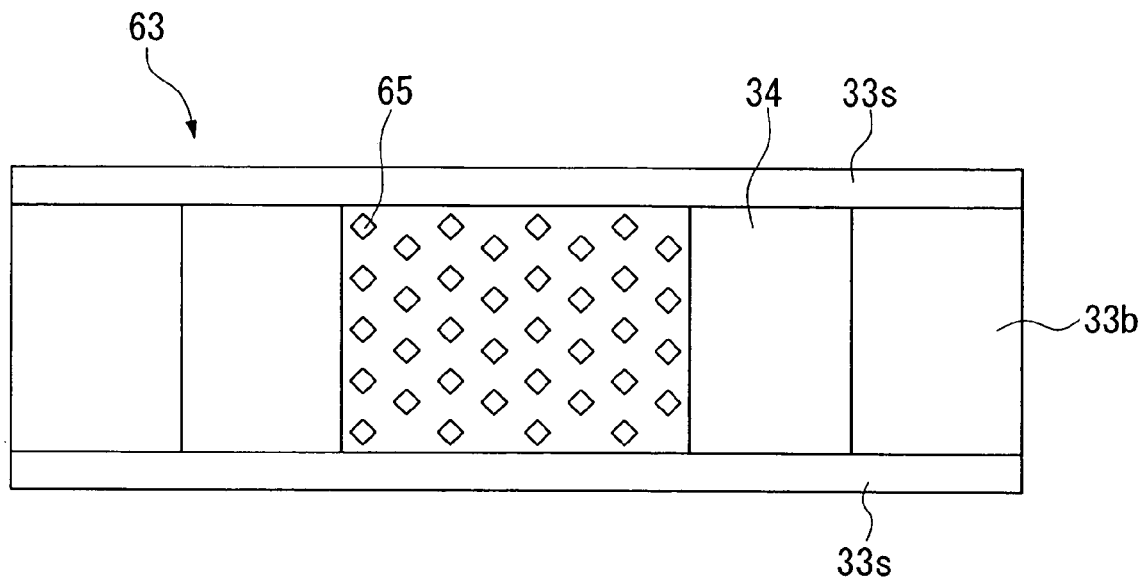
FIG. 26 is a plan view showing a variant of the base of the mounting unit of the light source apparatus according to the second embodiment of the first aspect of the present invention.
Figure 27:
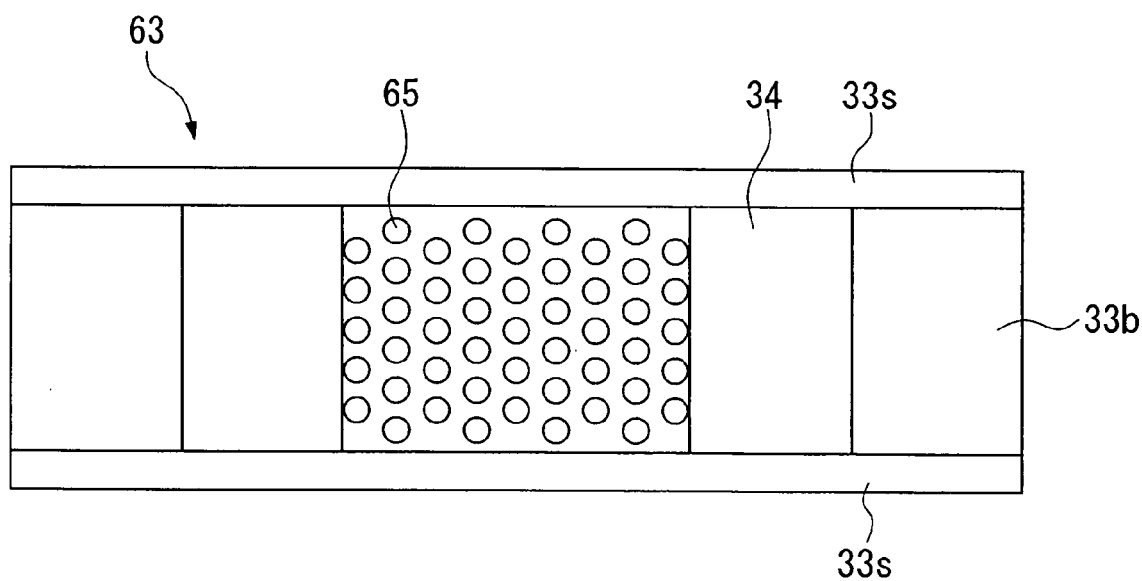
FIG. 27 is a plan view showing a variant of the base of the mounting unit of the light source apparatus according to the second embodiment of the first aspect of the present invention.

Note that the configuration and placement of the columns 65 on the base 63 may be a configuration and placement such as those described above or, as shown in FIG. 23, the columns 65 may be placed substantially equidistantly on a straight line in the main flow direction with the rows of these columns 65 being arranged substantially equidistantly in a vertical direction relative to the side walls 33s. Alternatively, as shown in FIG. 24, the rows in which the columns 65 are aligned may be arranged obliquely relative to the main flow direction. By employing a placement such as these, the occurrence of turbulence of the liquid L is increased and the heat transport capacity is improved. Moreover, as shown in FIGS. 25 through 27, the columns 65 may have a square, diamond-shaped, or circular shape, and is not particularly limited.

Next, an operation of a light source apparatus having the above-described structure, in particular, a mechanism of cooling the light source unit 20 will now be described. The emission of light from the light source unit 20 is the same as that of the first embodiment and a description thereof is omitted.

The liquid L flows into the mounting unit flow path 60c. When it approaches the center of the mounting unit 60, the flow rate thereof quickens because the cross-sectional area of the flow path is decreased by the narrowed flow portion 34. When the liquid L flows between the top surface of the narrowed flow portion 34 and the placement plate 31, the flow thereof is disturbed by the columns 65 and changes into a turbulent flow. That is, the liquid L that is flowing along a path where it collides with the columns 65 flows around the columns 65, and if the flow rate of the liquid L is faster than a predetermined flow rate, the liquid L flows while forming whirlpools in the downstream to the columns 65. As a result of the liquid L flowing around the columns 65, flow rate components that flow in directions other than the main flow direction increase. Moreover, flow rate components that flow in directions other than the main flow direction are further increased by the whirlpools formed in the downstream to the columns 65.

In the meantime, the heat that is generated in the LED chip 21 is transported to the placement plate 31, with which it is in direct contact, and to the columns 65 via the placement plate 31. As a result of the liquid L, which now has a turbulent flow and has improved heat transport capacity, removing heat from the placement plate 31 and the columns 65, it cools the LED chip 21, and flows out of the mounting unit 60.

Because the mechanism after the liquid L has flowed out of the mounting unit 60 is the same as in the first embodiment, a description thereof is omitted.

According to the above-described structure, by forming the columns 65 on the top surface of the narrowed flow portion 34, the liquid L that flows through those areas can be changed into a turbulent flow. As described above, because a turbulent flow has a greater heat transport capacity than a laminar flow, it is possible to more efficiently remove heat from the LED chip 21.

By placing the columns 65 on the mounting unit flow path 60c, the contact surface area between the LED chip 21 and the liquid L as regards heat transfer, that is, the heat transfer surface area can be increased, and a greater amount of heat can be dissipated to the liquid L from the LED chip 21, enabling the efficiency with which the LED chip 21 is cooled to be improved.

(Projection Display Apparatus)

Figure 28:
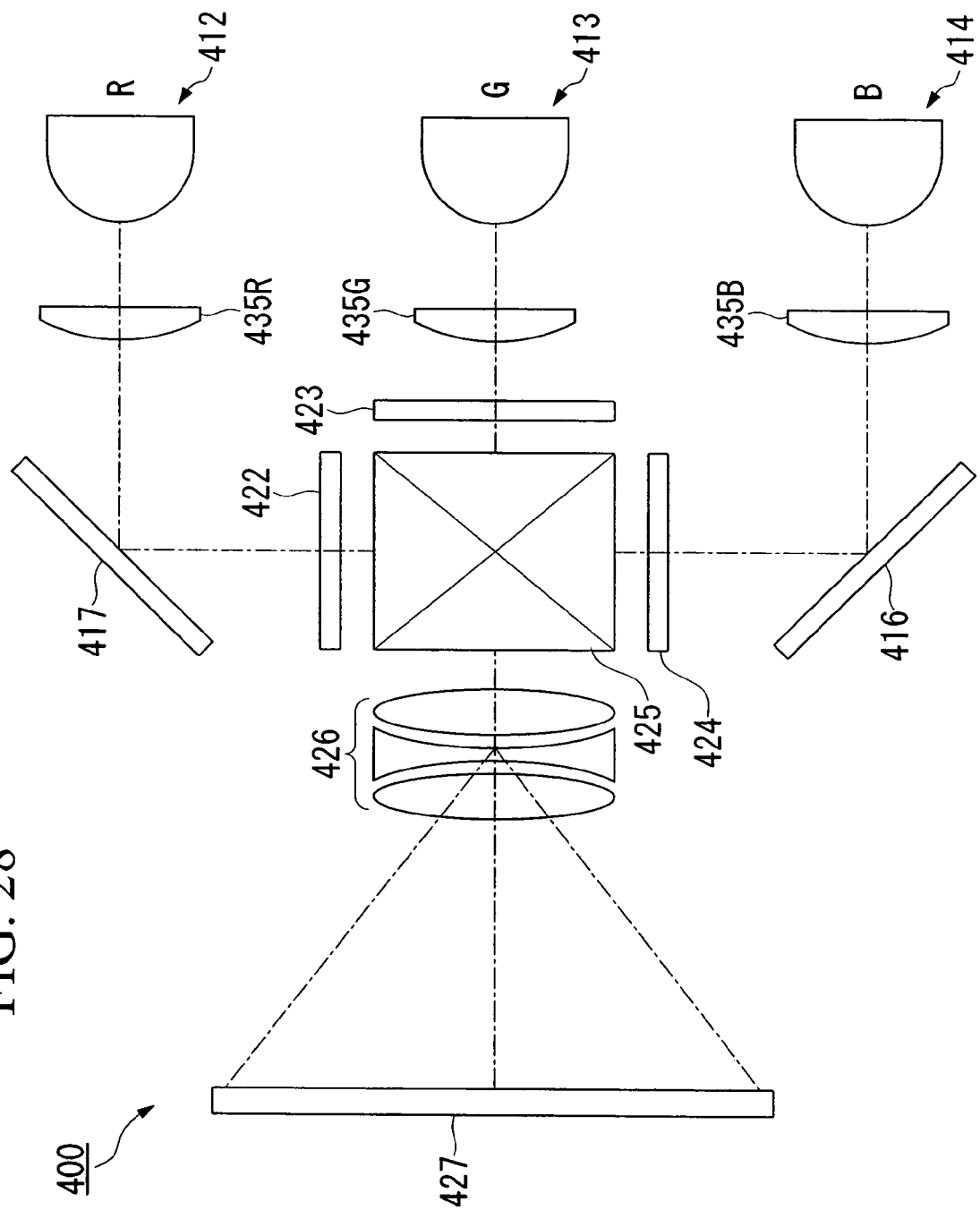
FIG. 28 is a schematic structural view of a projection display apparatus that uses a light source apparatus of the first aspect of the present invention.

FIG. 28 is a schematic diagram of a projector 400 (i.e., of a projection display apparatus) that is provided with the light source apparatus according to the present embodiment. In FIG. 28, the symbols 412, 413, and 414 show a light source apparatus of the present embodiment; the symbols 422, 423, and 424 show liquid crystal light bulbs (i.e., optical modulating means); the symbol 425 shows a cross-dichroic prism (i.e., a photosynthesizing means); and the symbol 426 shows a projection lens (i.e., a projection means).

The projector 400 shown in FIG. 28 is provided with three light source apparatuses 412, 413, and 414 that are structured as described in the present embodiment. LED that respectively emit red (R), green (G), and blue (B) light are employed in the respective light source apparatuses 412, 413, and 414. Note that a rod lens or fly-eye lens is placed to the rear of each light source apparatus as a uniform illumination system that makes the illuminance distribution of the light source light uniform.

Luminous flux from the red light source apparatus 412 passes through the superimposing lens 435R and is reflected by a reflecting mirror 417 so as to incident on the liquid crystal light bulb 422 for red light. Luminous flux from the green light source apparatus 413 passes through the superimposing lens 435G and incidents on the liquid crystal light bulb 423 for green light. Luminous flux from the blue light source apparatus 414 passes through the superimposing lens 435B and is reflected by a reflecting mirror 416 so as to incident on the liquid crystal light bulb 424 for blue light. Note that as a result of the luminous flux from each light source passing through a superimposing lens, it is superimposed in the display region of the liquid crystal light bulb so that the liquid crystal light bulb is uniformly illuminated.

Polarizing plates (not shown) are provided on the incidence side and emitting side of each liquid crystal light bulb. Accordingly, only linearly polarized light in a predetermined direction from among the luminous flux from each light source passes through the incidence side polarizing plate and incidents on the respective liquid crystal light bulbs. It is also possible to provide a polarization transformation means (not shown) before the incident side polarization plate. In this case, it becomes possible to recycle luminous flux that has been reflected by the incidence side polarization plates so as to make it incident on the respective liquid crystal light bulbs, and thereby achieve an improvement in the light utilization efficiency.

The light of the three colors that has been modulated by the respective liquid crystal light bulbs 422, 423, and 424 incidents on the cross-dichroic prism 425. This prism is made by bonding together four rectangular prisms, and a dielectric multilayer film that reflects red light at an inner surface thereof is placed in a cross-form configuration with a dielectric multilayer film that reflects blue light in the rectangular prisms. Light of three colors is composited by these dielectric multilayer films, so that light representing a color image is formed. The composited light is projected onto a projection screen 427 by the projection lens 426, which forms a projection optical system, so that an enlarged image is displayed.

In the above-described light source apparatus of the present embodiment, because the LED can be efficiently cooled, it is possible to increase the input current so as to achieve a higher level of luminance. Accordingly, by providing the above-described light source apparatus in a projector it is possible to provide a projector that is bright and has an excellent display quality.

Note that the technological scope of the present invention is not limited by the above-described embodiments. Various modifications can be made without departing from the spirit or scope of the present invention.

For example, in these embodiments, an LED chip is employed as the solid state light source, however, it is also possible to employ a semiconductor laser or the like as the solid state light source. Moreover, cooling fins are employed as the cooling means in these embodiments, however, it is also possible to employ a Peltier element and the like as the cooling means. Furthermore, a liquid crystal light bulb is employed as the optical modulator in the above-described projector, however, it is also possible to use a digital micro mirror device (DMD®) and the like as the optical modulator.

Second Aspect

First Embodiment

A description will now be given of a projection display apparatus that is the first embodiment of the second aspect of the present invention with reference made to FIGS. 29 through 38.

Figure 29:
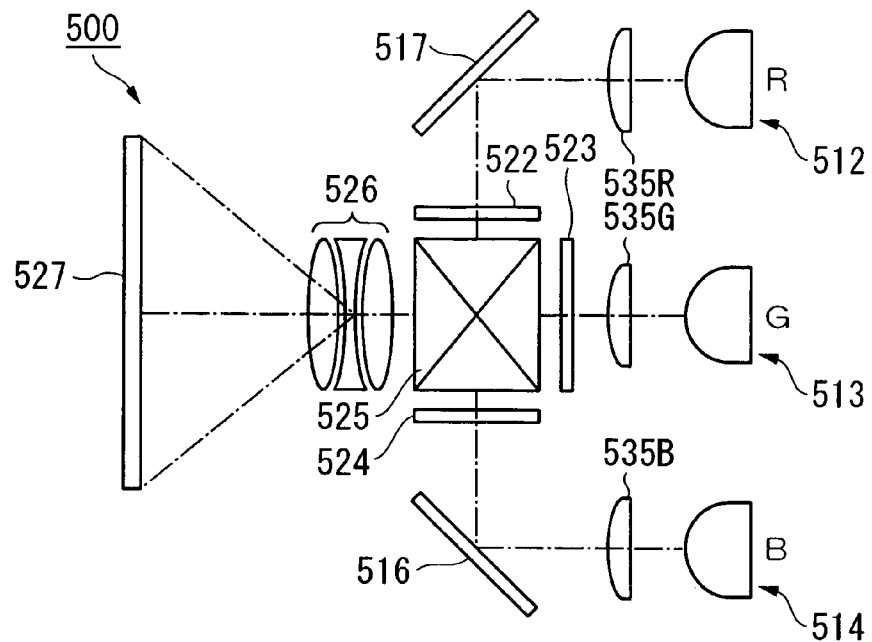
FIG. 29 is a schematic diagram of a projection display apparatus that is provided with a light source apparatus according to the second aspect of the present invention.

FIG. 29 is a schematic diagram of a projection display apparatus 500 that is provided with the light source apparatus according to the present embodiment. In FIG. 29, the symbols 512, 513, and 514 show a light source apparatus of the present embodiment; the symbols 522, 523, and 524 show liquid crystal light bulbs (i.e., optical modulating means); the symbol 525 shows a cross-dichroic prism (i.e., a photosynthesizing means); and the symbol 526 shows a projection lens (i.e., a projection means).

The projection display apparatus 500 shown in FIG. 29 is provided with three light source apparatuses 512, 513, and 514 that are structured as described in the present embodiment. LED that respectively emit red (R), green (G), and blue (B) light are employed in the respective light source apparatuses 512, 513, and 514. Note that a rod lens or fly-eye lens is placed to the rear of each light source apparatus as a uniform illumination system that makes the illuminance distribution of the light source light uniform.

Luminous flux from the red light source apparatus 512 passes through the superimposing lens 535R and is reflected by a reflecting mirror 517 so as to incident on the liquid crystal light bulb 522 for red light. Luminous flux from the green light source apparatus 513 passes through the superimposing lens 535G and incidents on the liquid crystal light bulb 523 for green light.

Luminous flux from the blue light source apparatus 514 passes through the superimposing lens 535B and is reflected by a reflecting mirror 516 so as to incident on the liquid crystal light bulb 524 for blue light. Note that as a result of the luminous flux from each light source passing through a superimposing lens, it is superimposed in the display region of the liquid crystal light bulb so that the liquid crystal light bulb is uniformly illuminated.

Polarizing plates (not shown) are provided on the incidence side and emitting side of each liquid crystal light bulb. Accordingly, only light that is linearly polarized in a predetermined direction from among the luminous flux from each light source passes through the incidence side polarizing plate and incidents on the respective liquid crystal light bulbs. It is also possible to provide a polarization transformation means (not shown) to the rear of the incident side polarization plate. In this case, it becomes possible to recycle luminous flux that has been reflected by the incidence side polarization plates so as to make it incident on the respective liquid crystal light bulbs, and thereby achieve an improvement in the light utilization efficiency.

The light of the three colors that has been modulated by the respective liquid crystal light bulbs 522, 523, and 524 incidents on the cross-dichroic prism 525. This prism is made by bonding together four rectangular prisms, and a dielectric multilayer film that reflects red light at an inner surface thereof is placed in a cross-form configuration with a dielectric multilayer film that reflects blue light in the rectangular prisms. Light of three colors is composited by these dielectric multilayer films, so that light representing a color image is formed. The composited light is projected onto a projection screen 527 by the projection lens 526, which forms a projection optical system, so that an enlarged image is displayed.

Next, the structure of the light source apparatus of the second aspect of the present invention will be described.

Figure 30:
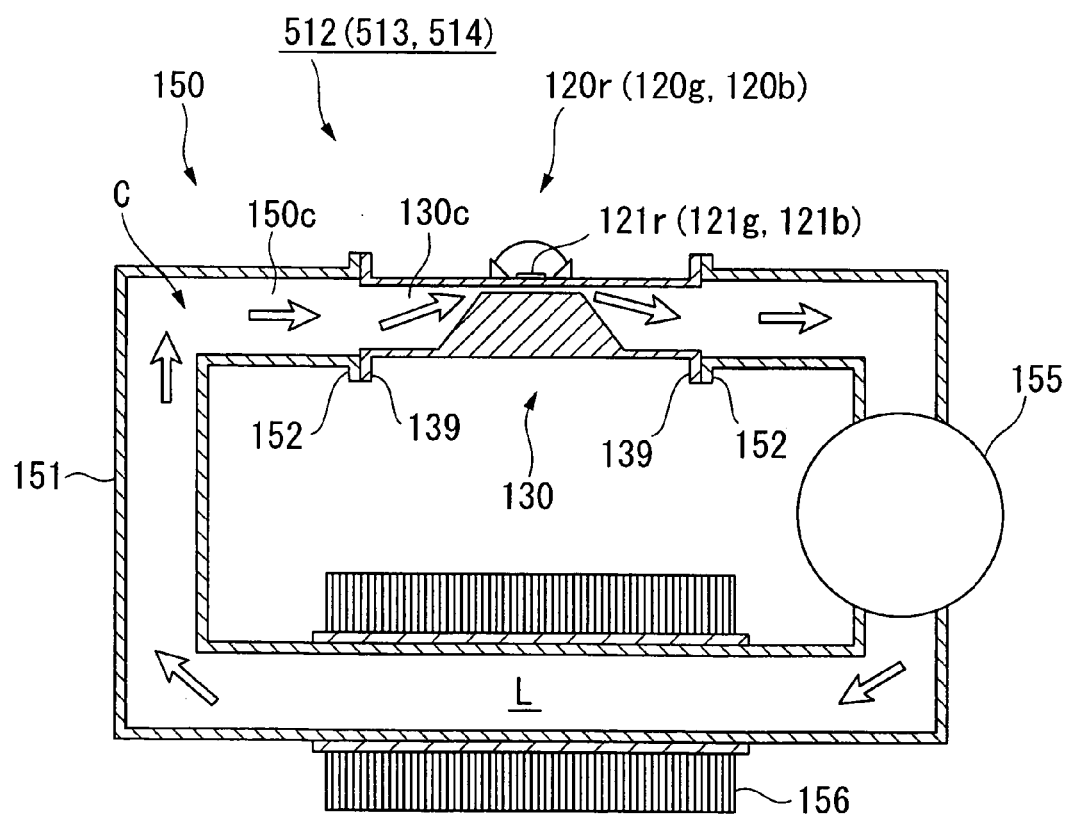
FIG. 30 is a schematic view of a light source apparatus of a first embodiment of the second aspect of the present invention.

FIG. 30 is a schematic view of the light source apparatus of the second aspect of the present invention.

In the light source apparatuses 512, 513, and 514, only the LED chips (solid state light sources) 121r, 121g, and 121b that emit the respective red (R), green (G), blue (B) colored light are different from each other. Therefore, here, a description is only given of the light source apparatus 512 that emits red (R) colored light, and a description of the light source apparatuses 513 and 514 that emit green (G) and blue (B) colored light is omitted.

As shown in FIG. 30, the light source apparatus 512 generally includes a light source unit 120r that emits red colored light, a mounting unit (i.e., a mounting unit) 130 on which the light source unit 120r is mounted, a circulation portion 150 that is coupled to the mounting unit 130 and that, together with the mounting unit 130, defines a circulation flow path C along which a liquid (i.e., a liquid medium) L flows, a circulation pump (i.e., a circulation means) 155 that causes the liquid L to circulate, and a cooling fin (i.e., a heat dissipation means) 156 that dissipates heat from the liquid L to the outside.

Figure 31:
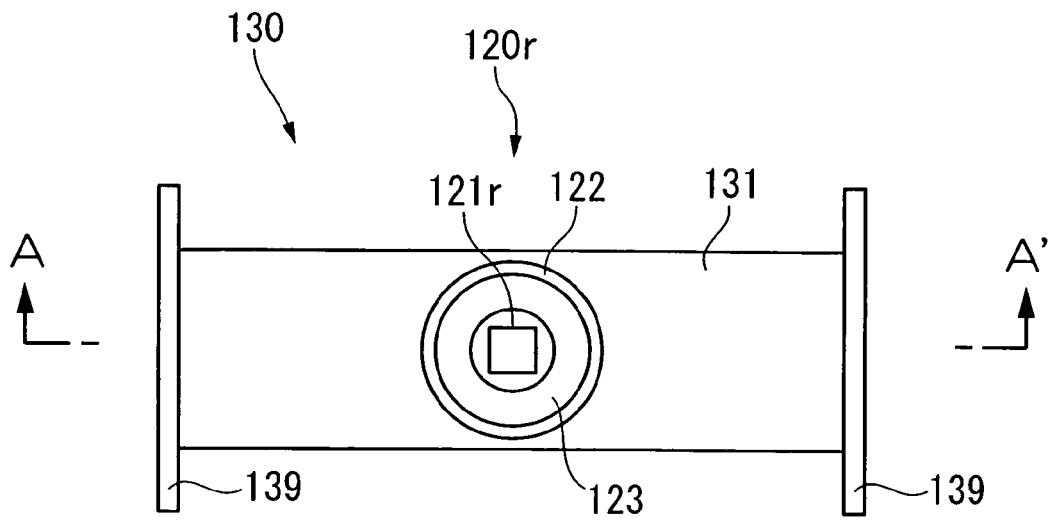
FIG. 31 is a plan view of a mounting unit of the light source apparatus of a first embodiment of the second aspect of the present invention.
Figure 32:
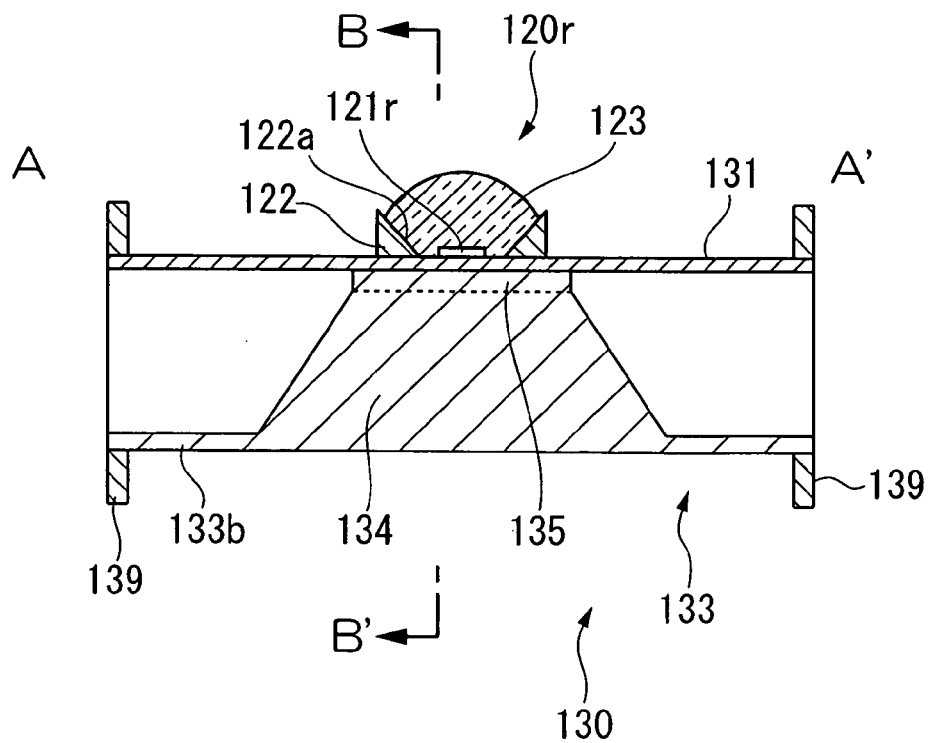
FIG. 32 is a cross-sectional view taken along a line A-A' in FIG. 31.
Figure 33:
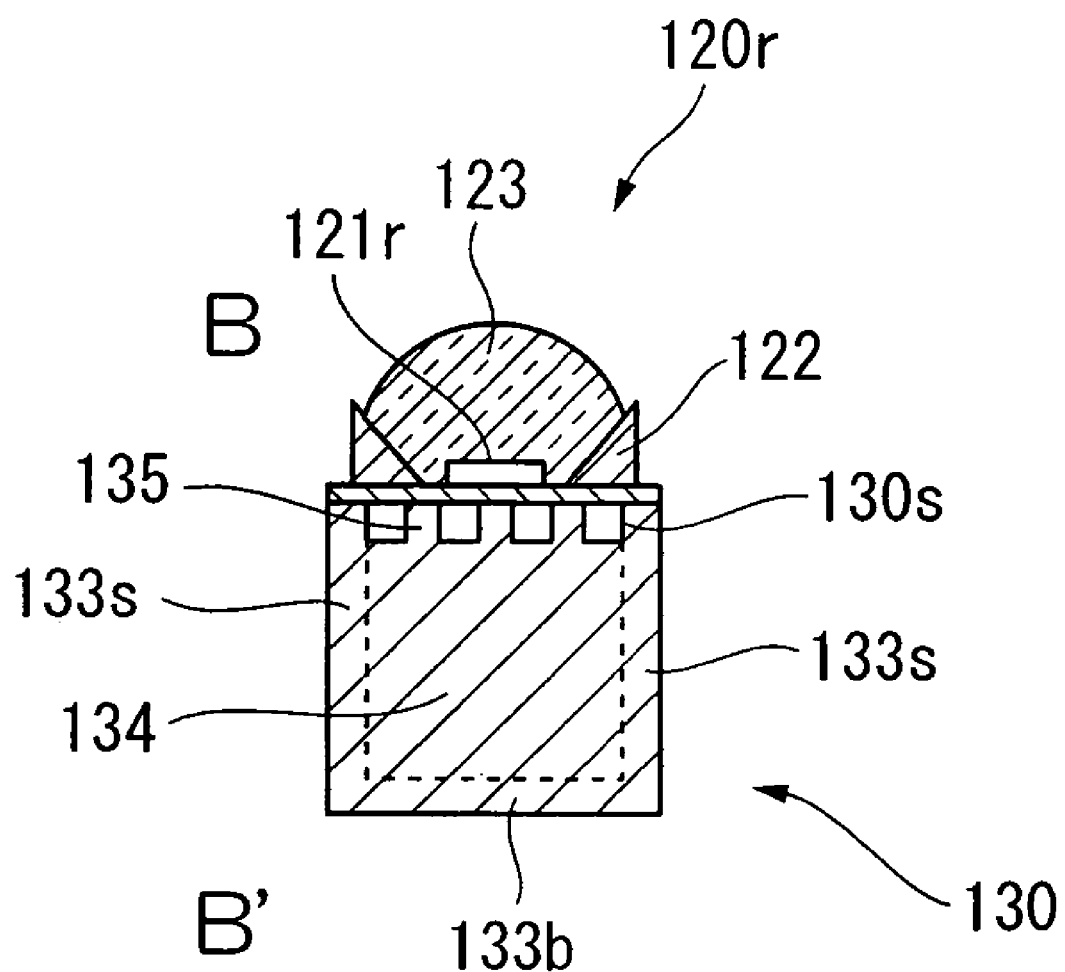
FIG. 33 is a cross-sectional view taken along a line B-B' in FIG. 32.

FIG. 31 is a plan view of a mounting unit of the light source apparatus. FIG. 32 is a cross-sectional view taken along a line A-A' in FIG. 31. FIG. 33 is a cross-sectional view taken along a line B-B' in FIG. 32.

As shown in FIGS. 31 through 34, the light source unit 120r has an LED chip (i.e., a solid state light source) 121r that emits red colored light, a reflection unit 122 that reflects light that is emitted to the sides back to an illuminated area, and a lens 123 that gathers the emitted light towards the illuminated area, or converts it into parallel rays that are directed towards the illuminated area.

The LED chip 121r is placed so as to be in direct contact with substantially a center of a top of a placement plate 131 (described below). Power is supplied to the LED chip 121r from the placement plate 131 with which it is in direct contact, and from a terminal (not shown) that is insulated from the placement plate 131.

The reflection unit 122 is placed on the same plane as the LED chip 121r and has an annular shape, as seen in plan view, centered on the LED chip 121r. A reflective surface 122a that is tilted to the illuminated area towards the outside is formed on a surface of the reflection unit 122 that faces the LED chip 121r.

The lens 123 is placed on the reflection unit 122. A top portion of the lens 123 has a convex shape so as to gather light that is emitted from the LED chip 121r onto the illuminated area or to convert this light into parallel rays that are directed towards the illuminated area. The lens 123 is made of a material having optical characteristics of allowing light emitted from the LED chip 121r to pass through without any of this light being lost, and is formed, for example, from a transparent material such as glass, an acrylic resin, a polycarbonate, or the like.

FIG. 34 is a side view of a mounting unit of an optical source apparatus.

As shown in FIGS. 31 through 34, the mounting unit 130 has a placement plate 131 on which the light source unit 120 is mounted, a base 133 that together with the placement plate 131 defines a mounting unit flow path (i.e., a flow path) 130c, which is a portion of the circulation flow path C, and flanges 139 (i.e., a joint portion) that are used in a coupling with the circulation portion 150 (described below).

The placement plate 131 is made of a material having a high thermal conductivity as well as electroconductivity such as metals, for example, Cu or Al, and is formed having the same shape as that of the base 133 when this is seen in plan view. The thickness of the placement plate 131 is smaller than the thickness of the side walls and bottom of the base 133.

Holes 139a that are used to insert engaging members such as bolts that are used when the flange 139 is coupled to the circulation portion 150 (described below) are defined in the flange 139. Note that these bolts or rivets may be used as the coupling members, and it is also possible to form threaded holes in a flange 152 of the circulation portion 150 (described below) and to screw the two together using threaded members. A variety of coupling methods in addition to these may also be used.

Figure 35:
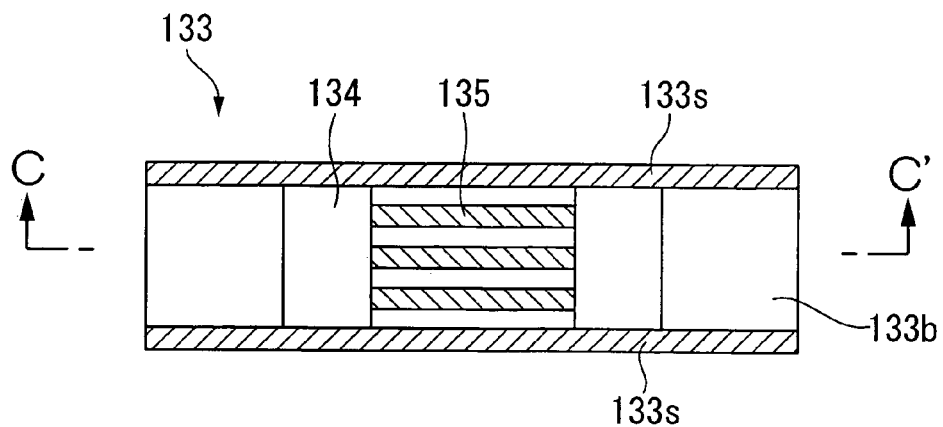
FIG. 35 is a plan view of a base of the mounting unit of the light source apparatus according to the first embodiment of the second aspect of the present invention.
Figure 36:
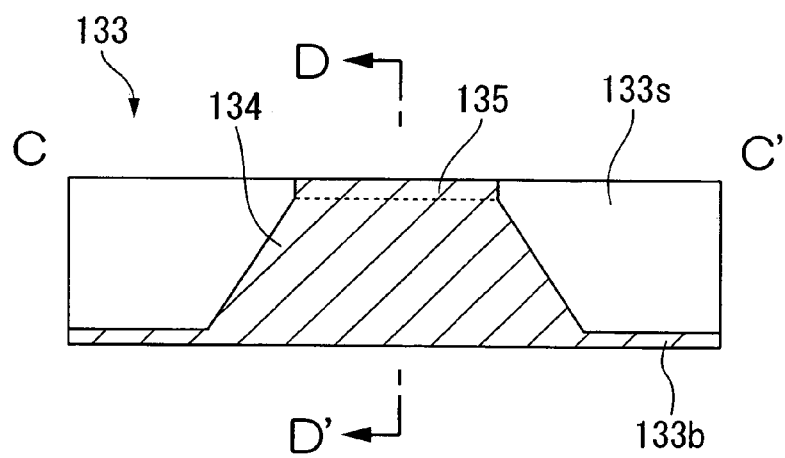
FIG. 36 is a cross-sectional view taken along a line C-C' in FIG. 35.

FIG. 35 is a plan view of the base of the mounting unit. FIG. 36 is a cross-sectional view taken along the line C-C' in FIG. 35, while FIG. 37 is a cross-sectional view taken along the line D-D' in FIG. 36.

Figure 37:
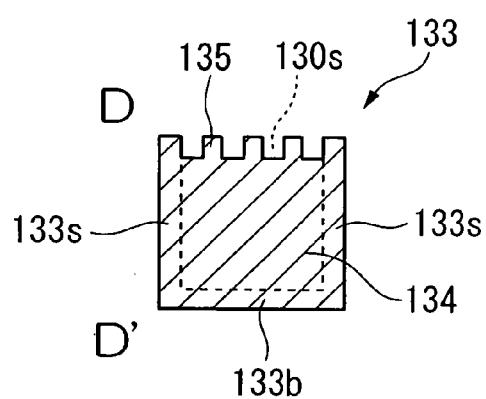
FIG. 37 is a cross-sectional view taken along a line D-D' in FIG. 36.

As shown in FIGS. 35 through 37, the base 133 is formed in a U shape that includes facing side walls 133s and a bottom 133b. A narrowed flow portion 134 having a trapezoid shape that becomes narrower towards the top is formed substantially in the center of the top surface of the bottom 133b and extending to the two side walls 133s.

The height of the narrowed flow portion 134 is lower than that of the side walls 133s, and the mounting unit flow path 130c is also defined between the narrowed flow portion 134 and the placement plate 131. Three walls 135 that divide the mounting unit flow path 130c are placed equidistantly in a row and in parallel with the side walls 133s (i.e., in the transverse direction in FIG. 35) on a top surface of the narrowed flow portion 134. The walls 135 are formed such that upper ends thereof are at the same level as upper ends of the side walls 133s. As a result of the walls 135 being placed so as to be in contact with the placement plate 131, the mounting unit flow path 130c is divided into four narrow flow paths 130s that each have the same cross-sectional area (see FIGS. 33 and 34).

Figure 38:
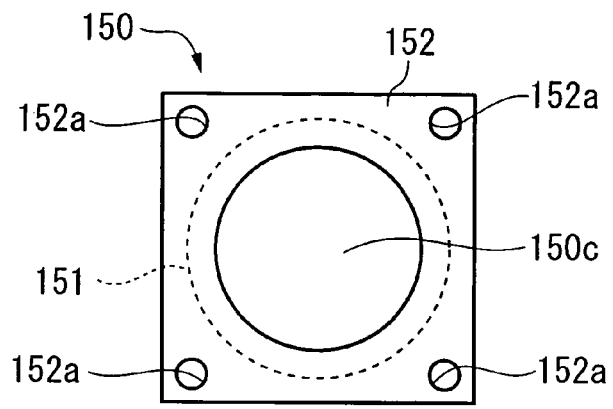
FIG. 38 is a side view of a flange of a circulating unit of the light source apparatus according to the first embodiment of the second aspect of the present invention.

FIG. 38 is a view of the flange of the circulation portion as seen from the side.

As shown in FIG. 30, the circulation portion 150 has a pipe shaped portion 151 in which a pipe shaped portion flow path 150c is defined, and flanges (i.e., coupling members) 152 that are provided at both ends of the pipe shaped portion 151 and that are used when the circulation portion 150 is coupled to the mounting unit 130.

A circulation pump 155 that causes the liquid L to circulate and a cooling fin 156 that cools the liquid L are placed in the pipe shaped portion 151. The pipe shaped portion 151 may be a pipe whose path can be changed freely such as a concertina shaped pipe or a pipe that is made of a material having flexibility. Note also that the pipe shaped flow path and the pipe shaped portion may have a circular cylinder configuration or a rectangular configuration, and the configuration thereof is not particularly limited.

Holes 152a that are used to insert the aforementioned coupling members that are used when the flanges 152 are coupled to the above-described mounting unit 130 are defined in the flanges 152.

As shown in FIG. 30, there may be no member inserted between the flange 139 of the mounting unit 130 and the flanges 152 of the circulation portion 152, or the two may be joined via a member designed to prevent liquid leakages such as packing or the like.

Note that the positional relationship between the circulation pump 155 and the cooling fin 156, as well as the direction of circulation of the liquid L may be the relationship shown in FIG. 30, or may be different from the illustrated ones, and is not particularly limited.

The liquid L can be selected from liquids that are non-corrosive to the members that are provided in the light source apparatuses 512, 513, and 514. More preferably, a liquid that has little vapor pressure, a low freezing point, excellent thermal stability, and a high thermal conductivity is desired. Examples of a liquid that can be used in the present invention include those that are typically used as organic liquid mediums such as biphenyldiphenylethers, alkylbenzenes, alkylbiphenyls, triaryldimethanes, alkylnaphthalenes, hydroterphenyls, and diarylalkanes. Silicone based and fluorine based liquids can also be used. The liquid may be selected from among these after further consideration is given to the applications of the light source apparatus, the required level of performance, environmental protection, and the like.

The cooling fin 156 is made of a metal such as, for example, Fe, Cu, Al, Mg, and the like, or by a material that includes these and has excellent thermal conductivity. As shown in FIG. 30, a plurality of fins are provided to the cooling fin 156 so as to increase the surface area thereof and improve the capacity of the fins to dissipate heat to the outside. In the present embodiment, the cooling fin 156 is secured using an appropriate means to a portion of the circulation portion 150 such that the thermal conduction from the circulation flow path C is not lost. It is also possible for the cooling fin 156 to be formed separately from the circulation portion 150, or to be formed integrally with the circulation portion 150. Moreover, if the amount of heat that is dissipated by just the natural convection current of air flowing between the fins is insufficient, it is also possible to increase the heat dissipation capacity still further by forcibly creating an air convection current by providing an electric cooling fan on the outside.

Note that, in the present embodiment, a description is given of a structure in which a cooling fin 156 is provided in order to enhance cooling, however, depending on the application and the environment in which of the light source apparatus is used, the present embodiment can also be applied to a structure in which the cooling fin 156 is not provided.

Next, a description will be given of the operation of the light source apparatuses 512, 513, and 514 having the above-described structure. Note that, because the operations are all the same in each of the light source apparatuses 512, 513, and 514, a description is given here of the light source apparatus 512, and a description of the light source apparatuses 513 and 514 is omitted.

Firstly, a description of an emission of light from the light source unit 120 will be given.

When power is supplied to the LED chip 121r from the placement plate 131 and the terminal, a red (R) colored light is emitted from the LED chip 121r to surrounding portions. The light that has been emitted upwards is propagated through the lens 123 and is gathered towards the illuminated area or is converted into parallel rays that are directed towards the illuminated area. Light that has been emitted to the sides and strikes the reflection unit 122 is reflected towards the lens 123, and is gathered towards the illuminated area or is converted into parallel rays that are directed towards the illuminated area and is then emitted.

Next, a description of the cooling of the light source unit 120 will be given.

The liquid L is circulated in the circulation flow path C by the circulation pump 155, and flows into the mounting unit flow path 130c. When the liquid L that has flowed into the mounting unit flow path 130c flows into the narrow flow paths 130s that are separated by the walls 135, the flow rate thereof quickens because the cross-sectional area of the flow path is decreased, and the flow changes from a laminar flow to a turbulent flow.

In the meantime, the heat that is generated in the LED chip 121r is transported to the placement plate 131, with which it is in direct contact, and to the walls 135 via the placement plate 131. As a result of the liquid L that now has a turbulent flow removing heat from the placement plate 131 and the walls 135, it cools the LED chip 121r.

The liquid L that has removed the heat and consequently has a raised temperature flows out from the narrow flow paths 130s and the narrowed flow portion 134. The flow rate thereof slows, and the liquid L flows from the mounting unit flow path 130c into the circulation portion flow path 150c. The liquid L that has flowed into the circulation portion flow path 150c flows into the circulation pump 155 where it is pressurized and sent under pressure towards the cooling fin 156. The heat from the liquid L that has flowed into the area where the cooling fin 156 is placed is transported to the cooling fin 156 via the pipe shaped portion 151. The heat that has been transported to the cooling fin 156 is dissipated to the outside, for example, into the air, and the liquid L is cooled. The cooled liquid L is once again introduced into the mounting unit flow path 130c where it cools the LED chip 121r.

According to the above-described structure, because the mounting unit 130 is removably coupled to the circulation portion 150, it is possible to remove the mounting unit 130 from the circulation portion 150 and mount the LED chips 121r, 121g, and 121b. Furthermore, an optical system such as the lens 123 can also be mounted after it has been removed from the circulation portion 150, thereby simplifying the manufacturing of the mounting unit 130.

Furthermore, when the light source apparatuses 512, 513, and 514 of the present invention are used in the projection display apparatus 500, it is possible to assemble the mounting unit 130 in the projection display apparatus 500 separately from the circulation portion 150, and to then couple the mounting unit 130 and the circulation portion 150, so that the manufacturing of the light source apparatuses 512, 513, and 514 are completed. That is, by separately assembling the mounting unit 130 and the circulation portion 150, any interference with the projection display apparatus 500 may be avoided. In addition, if the power supply circuit of the projection display apparatus 500 is connected to the LED chips 121r, 121g, and 121b in the form of the mounting unit 130, then a work space can be preserved so that the assembling task is made easier.

Moreover, when the light source apparatuses 512, 513, and 514 of the present invention are assembled in the projection display apparatus 500, firstly, the mounting unit 130 and the like are assembled in advance in the projection display apparatus 500, and subsequent to that the circulation portion 150, which has flexibility, is assembled in the projection display apparatus 500. At this time, because the circulation portion 150 has flexibility, interference with the projection display apparatus 500 is easily avoided. In addition, even if the circulation portion is one that is intertwined and meanders complicatedly, it can still be positioned easily, so that the light source apparatuses 512, 513, and 514 can be easily assembled.

In addition, because the mounting unit flow path 130c, which is a part of the circulation flow path C, is formed in the mounting unit 130, the LED chips 121r, 121g, and 121b and the mounting unit flow path 130c can be treated as a unit. For example, if the walls 135 that increase the heat exchange surface area are formed in the mounting unit flow path 130c, then because the LED chips 121r, 121g, and 121b and the mounting unit flow path 130c form a unit, it is possible to maintain the excellent cooling performance of the LED chips 121r, 121g, and 121b without any special consideration being required.

Using the circulation pump 155, the liquid L can be circulated between the mounting unit 130 and the cooling fins 156, thereby enabling the LED chips 121r, 121g, and 121b to be continuously cooled. As a result, the power that is input into the LED chips 121r, 121g, and 121b can be continuously increased, enabling the amount of light that is emitted from the LED chips 121r, 121g, and 121b to be continuously increased.

Moreover, because the LED chips 121r, 121g, and 121b can be cooled even if the surface areas of the LED chips 121r, 121g, and 121b are decreased and the etendue is lowered so that, additionally, a reduction in the size of the light source apparatuses 512, 513, and 514 is achieved, the amount of power that is input can be raised and a high level of luminance can be maintained.

Accordingly, by providing the above-described light source apparatuses 512, 513, and 514, it is possible to provide a projection display apparatus 500 that is bright and has an excellent display quality.

Second Embodiment

Next, the second embodiment of the second aspect of the present invention will be described with reference made to FIG. 39.

The basic structure of the projection display apparatus of the present embodiment is the same as that in the first embodiment, however, the light source apparatuses are different from those in the first embodiment. Accordingly, in the present embodiment, a description is only given of the area around the light source apparatuses using FIG. 39, and a description of the liquid crystal light bulbs is omitted.

Figure 39:
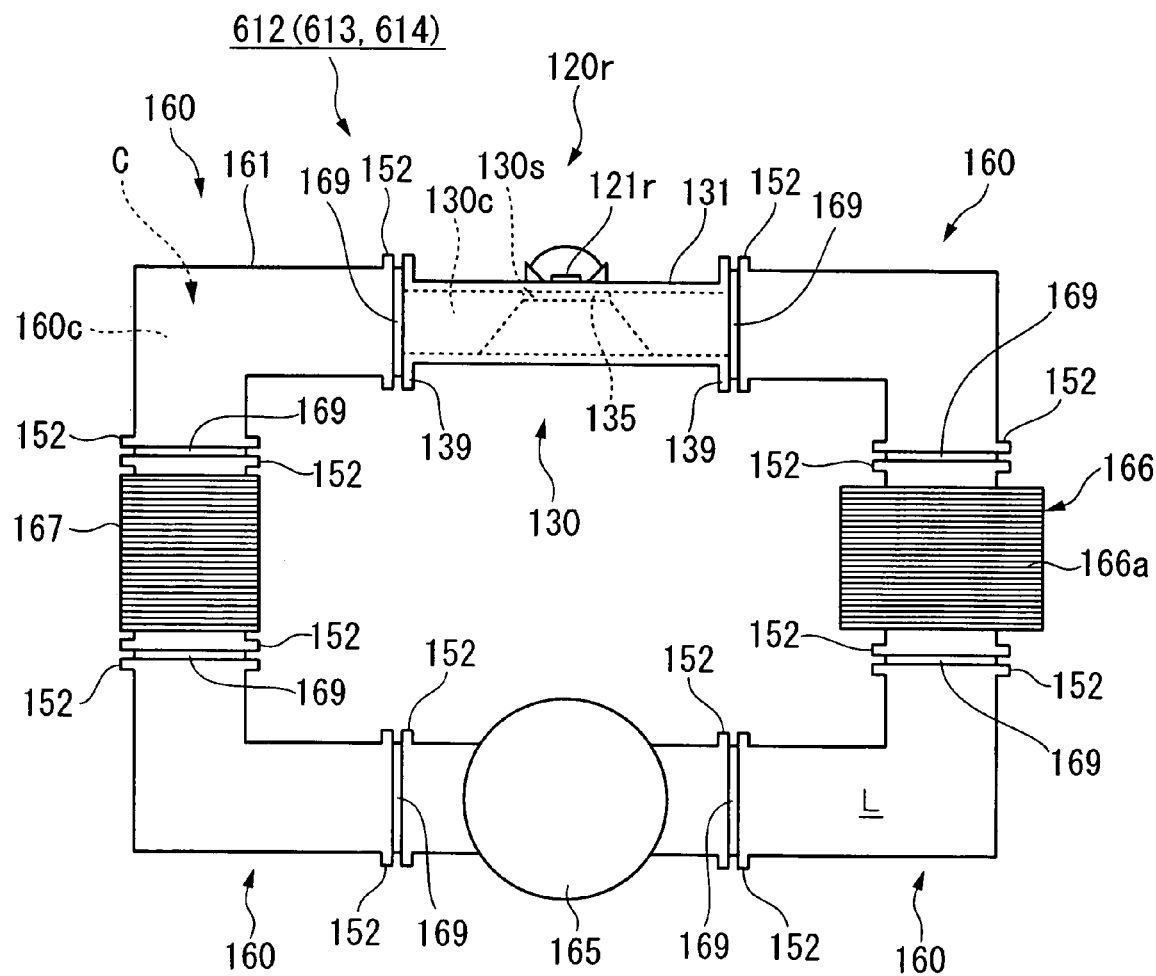
FIG. 39 is a schematic view of a light source apparatus of a second embodiment of the second aspect of the present invention.

FIG. 39 is a schematic view showing a light source apparatus of the projection display apparatus of the second aspect of the present invention.

In the light source apparatuses 612, 613, and 614, only the LED chips (solid state light sources) 121r, 121g, and 121b that emit the respective red (R), green (G), blue (B) colored light are different from each other. Therefore, here, a description is only given of the light source apparatus 612 that emits red (R) colored light, and a description of the light source apparatuses 613 and 614 that emit green (G) and blue (B) colored light is omitted. In addition, in the light source apparatus 612, component elements that are the same as those in the light source apparatus 512 of the first embodiment are referred to by the same reference symbols and a description thereof is omitted.

As shown in FIG. 39, the light source apparatus 612 generally includes a light source unit 120r that emits red colored light, a mounting unit 130 on which the light source unit 120r is mounted, a circulation portion 160 that defines a circulation flow path C along which a liquid L circulates, a circulation pump (i.e., a circulation means) 165 that causes the liquid L to circulate, a heat dissipation member (i.e., a heat dissipation means) 166 that dissipates heat from the liquid L to the outside, and a cooling unit 167 that removes heat from the liquid L.

As shown in FIG. 39, the circulation portion 160 has a pipe shaped portion 161 in which a pipe shaped portion flow path 160c is defined, and flanges 152 that are provided at both ends of the pipe shaped portion 161. The pipe shaped portion 161 may be a pipe whose path can be changed freely such as a concertina shaped pipe or a pipe that is made of a material having flexibility.

A flow path that defines a portion of the circulation flow path C is formed in the circulation pump 165, and the flanges 152 are provided at each end of the flow path.

A cooling fin 166a that is made of a metal such as, for example, Fe, Cu, Al, Mg, and the like, or of a material that includes these and has excellent thermal conductivity is formed in the heat dissipation member 166. As shown in FIG. 39, a plurality of fins are provided to the cooling fin 166a so as to increase the surface area thereof and improve the capacity of the fins to dissipate heat to the outside. In addition, a flow path that defines a portion of the circulation flow path C is formed in the heat dissipation member 166, and the flanges 152 are provided at each end of the flow path.

The cooling unit 167 is provided with a low temperature heat source (not shown) that has a lower temperature than surrounding portions, and is able to forcibly remove heat from the liquid L by using the low temperature heat source. Low temperature substances such as, for example, liquid nitrogen or heat transport means such as Peltier elements can be used as the low temperature heat source. In addition, a flow path that defines a portion of the circulation flow path C is formed in the cooling unit 167, and the flanges 152 are provided at each end of the flow path.

As shown in FIG. 39, the mounting unit 130, the circulation pump 165, the cooling fin 166, and the cooling unit 167 are coupled together with the circulation portion 160 placed between them so as to define the circulation flow path C. Note that this combination may be one in which, as shown in FIG. 39, starting clockwise from the mounting unit 130, the circulation portion 160, the cooling fin 166, the circulation portion 160, the circulation pump 165, the circulation portion 160, the cooling unit 167, and the circulation portion 160 may be coupled in this order. Alternatively, the circulation portions 160 can be omitted if appropriate, and the combination may be altered to one in which the order of the mounting unit 130, the circulation pump 165, the cooling fin 166, and the cooling unit 167 is changed.

Moreover, packing 169 is provided in order to prevent the liquid L from leaking onto the respective couplings. Note that, as described above, it is possible to either use or not use the packing 169.

Next, a description will be given of the operation of the light source apparatuses 612, 613, and 614 having the above-described structure. Note that, because the operations are all the same in each of the light source apparatuses 612, 613, and 614, a description is given here of the light source apparatus 612, and a description of the light source apparatuses 613 and 614 is omitted. In addition, because the emission of light from the light source unit 120r is the same as in the first embodiment, a description thereof is omitted.

A description of the cooling of the light source unit 120r in the light source unit 612 will now be given.

The liquid L is circulated in the circulation flow path C by the circulation pump 165, and flows into the mounting unit flow path 130c. When the liquid L that has flowed into the mounting unit flow path 130c flows into the narrow flow paths 130s that are separated by the walls 135, the flow rate thereof quickens because the cross-sectional area of the flow path is decreased, and the flow changes from a laminar flow to a turbulent flow.

In the meantime, the heat that is generated in the LED chip 121r is transported to the placement plate 131, with which it is in direct contact, and to the walls 135 via the placement plate 131. As a result of the liquid L that now has a turbulent flow removing heat from the placement plate 131 and the walls 135, it cools the LED chip 121r.

The liquid L that has removed the heat and consequently has a raised temperature flows out from the narrow flow paths 130s and the narrowed flow portion 134. The flow rate thereof slows, and the liquid L flows from the mounting unit flow path 130c into the circulation portion flow path 160c. From there it flows into the heat dissipation member 166.

The heat from the liquid L that has flowed into the heat dissipation member 166 is transported from the liquid L to the cooling fin 166a and is then dissipated to the outside, for example, into the air, and the liquid L is cooled. The cooled liquid L then flows into the circulation pump 165 via the circulation flow path 160c.

The liquid L that has flowed into the circulation pump 165 is pressurized and sent under pressure towards the cooling unit 167. The heat from the liquid L that has flowed into the cooling unit 167 is removed by the low temperature heat source of the cooling unit 167 so that the temperature of the liquid L is further lowered. Thereafter, the liquid L once again flows into the mounting unit 130 via the circulation flow path 160c, and cools the LED chip 121.

According to the above-described structure, because the circulation pump 165, the heat dissipation member 166, and the cooling unit 167 each are removably coupled to the circulation portions 160, it is possible even to avoid interference between the projection display apparatus 500 and the circulation pump 165, the heat dissipation member 166, and the cooling unit 167, and for the ease of assembly to be improved. In addition, once the projection display apparatus 500 has been assembled, because it is possible to remove the circulation pump 165, the heat dissipation member 166, and the cooling unit 167 only, exchanging the circulation pump 165, the heat dissipation member 166, and the cooling unit 167, as well as the upkeep and maintenance of the light source apparatuses 612, 613, and 614 can be easily accomplished.

Because it is possible to treat the circulation pump 165, the heat dissipation member 166, and the cooling unit 167 as individual components, by standardizing the shape of the flanges 139 of the mounting unit 130 with the shape of the flanges 152 of the circulation pump 165, the heat dissipation member 166, the cooling unit 167 and the like, then it becomes possible to use not only a circulation pump 165, a heat dissipation member 166, and a cooling unit 167 that have been specifically designed for the projection display apparatus 500, but to also use a circulation pump 165, a heat dissipation member 166, and a cooling unit 167 that have been designed for other projection display apparatuses.

Third Embodiment

Next, the third embodiment of the second aspect of the present invention will be described with reference made to FIG. 40.

The basic structure of the projection display apparatus of the present embodiment is the same as that in the first embodiment, however, the light source apparatuses are different from those in the first embodiment. Accordingly, in the present embodiment, a description is only given of the area around the light source apparatuses using FIG. 40, and a description of the liquid crystal light bulbs is omitted.

Figure 40:
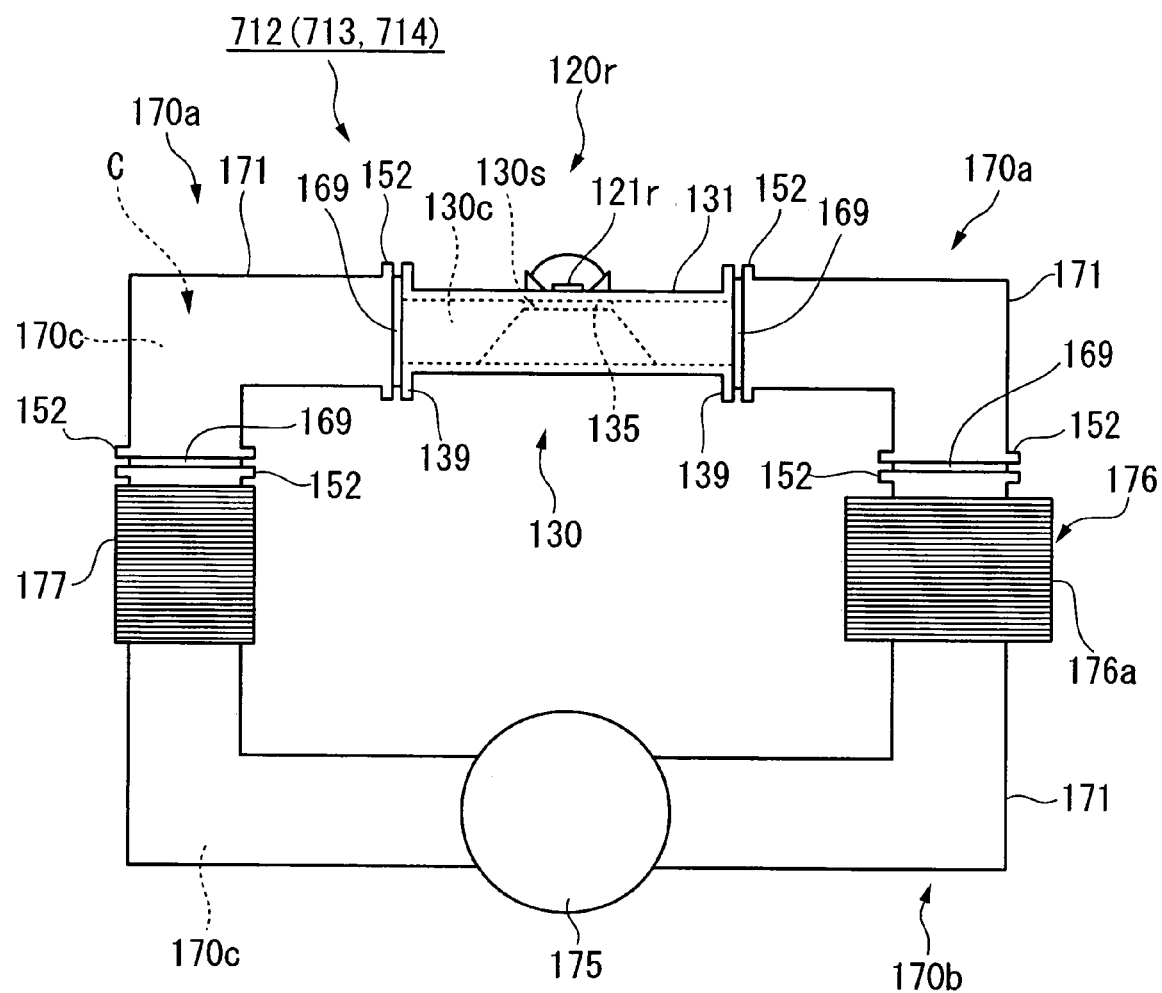
FIG. 40 is a schematic view of a light source apparatus of a third embodiment of the second aspect of the present invention.

FIG. 40 is a schematic view showing a light source apparatus of the projection display apparatus of the second aspect of the present invention.

In the light source apparatuses 712, 713, and 714, only the LED chips (solid state light sources) 121r, 121g, and 121b that emit the respective red (R), green (G), blue (B) colored light are different from each other. Therefore, here, a description is only given of the light source apparatus 712 that emits red (R) colored light, and a description of the light source apparatuses 713 and 714 that emit green (G) and blue (B) colored light is omitted. In addition, in the light source apparatus 712, component elements that are the same as those in the light source apparatus 512 of the first embodiment are referred to by the same reference symbols and a description thereof is omitted.

As shown in FIG. 40, the light source apparatus 712 generally includes a light source unit 120r that emits red colored light, a mounting unit 130 on which the light source unit 120r is mounted, first circulation portions 170a that define a portion of the circulation flow path C along which a liquid L circulates, a second circulation portion 170b that also defines a portion of the circulation flow path C, a circulation pump (i.e., a circulation means) 175 that is provided on the second circulation portion 170b and that causes the liquid L to circulate, a heat dissipation member (i.e., a heat dissipation means) 176 that is also provided on the second circulation portion 170b and that dissipates heat from the liquid L to the outside, and a cooling unit 177 that is also provided on the second circulation portion 170b and that removes heat from the liquid L.

As shown in FIG. 40, the first circulation portions 170a and the second circulation portion 170b have a pipe shaped portion 171 in which a pipe shaped portion flow path 170c is defined, and flanges 152 that are provided at both ends of the pipe shaped portion 171. The pipe shaped portion 171 may be a pipe whose path can be changed freely such as a concertina shaped pipe or a pipe that is made of a material having flexibility.

A cooling fin 176a that is made of a metal such as, for example, Fe, Cu, Al, Mg, and the like, or of a material that includes these and has excellent thermal conductivity is formed in the heat dissipation member 176. As shown in FIG. 40, the cooling fin 176a includes a plurality of fins to so as to increase the surface area thereof and improve the capacity of the fins to dissipate heat to the outside. In the present embodiment, the cooling fins 176a is secured using a suitable means to a portion of the circulation portion 170b such that there is no loss of thermal conduction from the liquid L.

The cooling unit 177 is provided with a low temperature heat source (not shown) that has a lower temperature than surrounding portions, and is able to forcibly remove heat from the liquid L that is flowing through the pipe shaped portion flow path 170c by using the low temperature heat source.

As shown in FIG. 40, the circulation pump 175, the heat dissipation member 176, and the cooling unit 177 are positioned such that the heat dissipation member 176 is located upstream from the circulation pump 175, and such that the cooling unit 177 is located downstream from the circulation pump 175. Moreover, a first circulation portion 170a is positioned between the mounting unit 130 and the second circulation portion 170b. Note that, if necessary, it is also possible to decrease the number of first circulation portions 170a or to use a first circulation portion 170a of which overall length is long. Furthermore, as described above, on the second circulation portion 170b there may be provided the three elements: i.e., the circulation pump 175, the heat dissipation member 176, and the cooling unit 177, or further elements may be added. Alternatively, these same elements may be increased in number, or even decreased in number.

Next, a description will be given of the operation of the light source apparatuses 712, 713, and 714 having the above-described structure. Note that, because the operations are all the same in each of the light source apparatuses 712, 713, and 714, a description is given here of the light source apparatus 712, and a description of the light source apparatuses 713 and 714 is omitted. In addition, because the emission of light from the light source unit 120r is the same as in the first embodiment, a description thereof is omitted.

A description of the cooling of the light source unit 120r in the light source unit 712 will now be given.

The liquid L is circulated in the circulation flow path C by the circulation pump 175, and flows into the mounting unit flow path 130c. When the liquid L that has flowed into the mounting unit flow path 130c flows into the narrow flow paths 130s that are separated by the walls 135, the flow rate thereof quickens because the cross-sectional area of the flow path is decreased, and the flow changes from a laminar flow to a turbulent flow.

In the meantime, the heat that is generated in the LED chip 121r is transported to the placement plate 131, with which it is in direct contact, and to the walls 135 via the placement plate 131. As a result of the liquid L that now has a turbulent flow removing heat from the placement plate 131 and the walls 135, it cools the LED chip 121r.

The liquid L that has removed the heat and consequently has a raised temperature flows out from the narrow flow paths 130s and the narrowed flow portion 134. The flow rate thereof slows, and the liquid L flows from the mounting unit flow path 130c into the circulation portion flow path 170c. From there it flows into the heat dissipation member 176.

The heat from the liquid L that has flowed into the heat dissipation member 176 is transported from the liquid L to the cooling fin 176 and is then dissipated to the outside, for example, into the air, and the liquid L is cooled. The cooled liquid L then flows into the circulation pump 175 via the circulation flow path 170c.

The liquid L that has flowed into the circulation pump 175 is pressurized and sent under pressure towards the cooling unit 177. The heat from the liquid L that has flowed into the cooling unit 177 is removed by the low temperature heat source of the cooling unit 177 so that the temperature of the liquid L is further lowered. Thereafter, the liquid L once again flows into the mounting unit 130 via the circulation flow path 170c, and cools the LED chip 121r.

According to the above-described structure, because the circulation portion is divided into two sections, that is, the first circulation portion 170a and the second circulation portion 170b, it is possible to avoid interference between the projection display apparatus 500 and the light source apparatuses 712, 713, and 714 when the light source apparatuses 712, 713, and 714 are being assembled in the projection display apparatus 500, so that the ease of assembly is improved.

Moreover, because the circulation pump 175, the heat dissipation member 176, and the cooling unit 177 are provided as a unit in the second circulation portion 170b, the circulation pump 175, the heat dissipation member 176, and the cooling unit 177 can be assembled in a single operation in the projection display apparatus 500, so that the number of operations needed to assemble the circulation pump 175, the heat dissipation member 176, and the cooling unit 177 in the projection display apparatus 500 is decreased, and productivity is improved.

Fourth Embodiment

Next, the fourth embodiment of the second aspect of the present invention will be described with reference made to FIG. 41.

The basic structure of the projection display apparatus of the present embodiment is the same as that in the first embodiment, however, the light source apparatuses are different from those in the first embodiment. Accordingly, in the present embodiment, a description is only given of the area around the light source apparatuses using FIG. 41, and a description of the liquid crystal light bulbs is omitted. Note that component elements that are the same as those in the light source apparatuses of the first through third embodiments are referred to by the same reference symbols and a description thereof is omitted.

Figure 41:
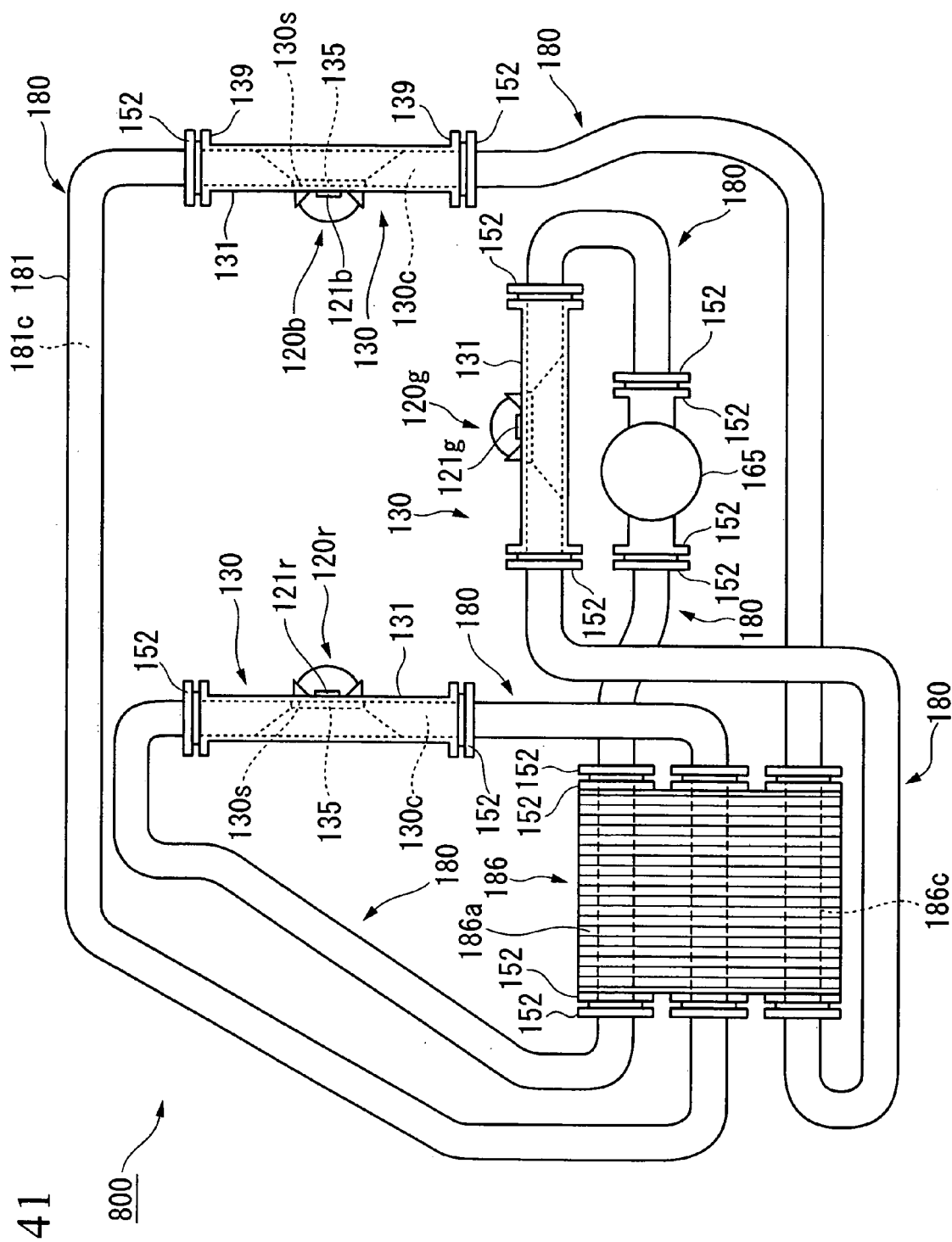
FIG. 41 is a schematic view of a light source apparatus of a fourth embodiment of the second aspect of the present invention.

FIG. 41 is a schematic view showing a light source apparatus of the projection display apparatus of the second aspect of the present invention.

As shown in FIG. 41, the light source apparatus 800 generally includes light source units 120r, 120g, and 120b that respectively emit red (R), green (G), and blue (B) colored light, a mounting unit 130 on which the light source units 120r, 120g, and 120b are mounted, a circulation portion 180 that defines a circulation flow path C along which a liquid L circulates, a circulation pump 165 that causes the liquid L to circulate, and a heat dissipation member (i.e., a heat dissipation means) 186 that dissipates heat from the liquid L to the outside.

In the light source units 120r, 120g, and 120b, only the LED chips 121r, 121g, and 121b that emit the respective red (R), green (G), blue (B) colored light are different. Therefore, because the remaining component elements are the same, a description thereof is omitted.

As shown in FIG. 41, the circulation portion 180 has a pipe shaped portion 181 in which a pipe shaped portion flow path 180c is defined, and flanges 152 that are provided at both ends of the pipe shaped portion 181. The pipe shaped portion 181 may be a pipe whose path can be changed freely such as a concertina shaped pipe or a pipe that is made of a material having flexibility.

A cooling fin 186a that is made of a metal such as, for example, Fe, Cu, Al, Mg, and the like, or of a material that includes these and has excellent thermal conductivity is formed in the heat dissipation member 186. As shown in FIG. 41, three substantially parallel flow paths 186c are formed inside the heat dissipation member 186, and flanges 152 are provided at the two ends of each flow path 186c to make a total of six flanges. Note that, as described above, the heat dissipation member 186 may be provided with three flow paths 186c inside a single housing, or one flow path 186c may be provided in a single housing and three heat dissipation members provided.

The mounting unit 130 on which the respective light source units 120r, 120g, and 120b are mounted, the circulation pump 165, and the heat dissipation member 186 are connected in series by the circulation portion 180. That is, starting from the circulation pump 165 in the flow direction of the liquid L are connected in this sequence the circulation portion 180, the heat dissipation member 186, the circulation portion 180, the mounting unit 130 on which the light source unit 120r is mounted, the circulation portion 180, the heat dissipation member 186, the circulation portion 180, the mounting unit 130 on which the light source unit 120b is mounted, the circulation portion 180, the heat dissipation member 186, the circulation portion 180, the mounting unit 130 on which the light source unit 120g is mounted, the circulation portion 180, and the circulation pump 165.

Next, a description will be given of the operation of the light source apparatus 800 having the above-described structure. Note that, because the emission of light from the light source units 120r, 120g, and 120b is the same as in the first embodiment, a description thereof is omitted.

A description of the cooling of the light source unit 120r, 120g, and 120b in the light source apparatus 800 will now be given. Note that, because the cooling operation inside the mounting unit 130 is the same as in the first embodiment, a description thereof is omitted.

The liquid L is forwarded under pressure by the circulation pump 165 and flows into the heat dissipation member 186. The heat from the liquid L is transported from the liquid L to the cooling fin 186, and is dissipated to the outside, for example, to the air. As a result, the liquid L is cooled.

The cooled liquid L then flows via the circulation flow path 180c into the mounting unit 130 on which the light source unit 120r is mounted. The liquid L that has flowed into the mounting unit 130 removes heat from the LED chip 121r, and flows out into the circulation flow path 180c. It then once again flows into the heat dissipation member 186. The liquid L then dissipates the heat it has removed from the LED chip 121r to the outside via the cooling fin 86, resulting in the temperature of the liquid L being lowered. The liquid L then flows out into the circulation flow path 180c, and flows into the mounting unit 130 where the light source unit 120b has been mounted.

The liquid L that has flowed into the mounting unit 130 removes heat from the LED chip 121b, and flows out into the circulation flow path 180c. It then once again flows into the heat dissipation member 186. The liquid L then dissipates the heat it has removed from the LED chip 121b to the outside, resulting in the temperature of the liquid L being lowered. The liquid L then flows out into the circulation flow path 180c, and flows into the mounting unit 130 where the light source unit 120g has been mounted. The liquid L that has flowed into the mounting unit 130 removes heat from the LED chip 121g, and flows out into the circulation flow path 180c. It then flows into the circulation pump 165 and once again is sent under pressure to the heat dissipation member 186.

According to the above-described structure, it is possible to cause the liquid L to circulate in series to the three LED chips 121r, 121g, and 121b using a single circulation pump 165 and circulation portions 180. Accordingly, the heat generated from the LED chips 121r, 121g, and 121b is carried to a single heat dissipation member 186, and can be dissipated from there to the outside.

That is, it is possible for the number of circulation pumps and heat dissipation members that are reduced to be decreased to fewer than when a circulation pump and heat dissipation member are provided for each of the LED chips that each emit a different colored light. As a result, the manufacturing costs and manufacturing steps needed to manufacture the light source apparatus 800 and projection display apparatus can be reduced.

Moreover, when the light source apparatus 800 is assembled in the projection display apparatus, because the mounting units 130, the circulation pump 165, and the heat dissipation member 186 are assembled as separate units, and the circulation portions 180 is subsequently assembled, as shown in FIG. 41, even if the light source apparatus 800 has a complex flow path structure, the projection display apparatus can be easily assembled.

Fifth Embodiment

Next, the fifth embodiment of the second aspect of the present invention will be described with reference made to FIG. 42.

The basic structure of the projection display apparatus of the present embodiment is the same as that in the first embodiment, however, the light source apparatuses are different from those in the first embodiment. Accordingly, in the present embodiment, a description is only given of the area around the light source apparatuses using FIG. 42, and a description of the liquid crystal light bulbs is omitted. Note that component elements that are the same as those in the light source apparatuses of the first through fourth embodiments are referred to by the same reference symbols and a description thereof is omitted.

Figure 42:
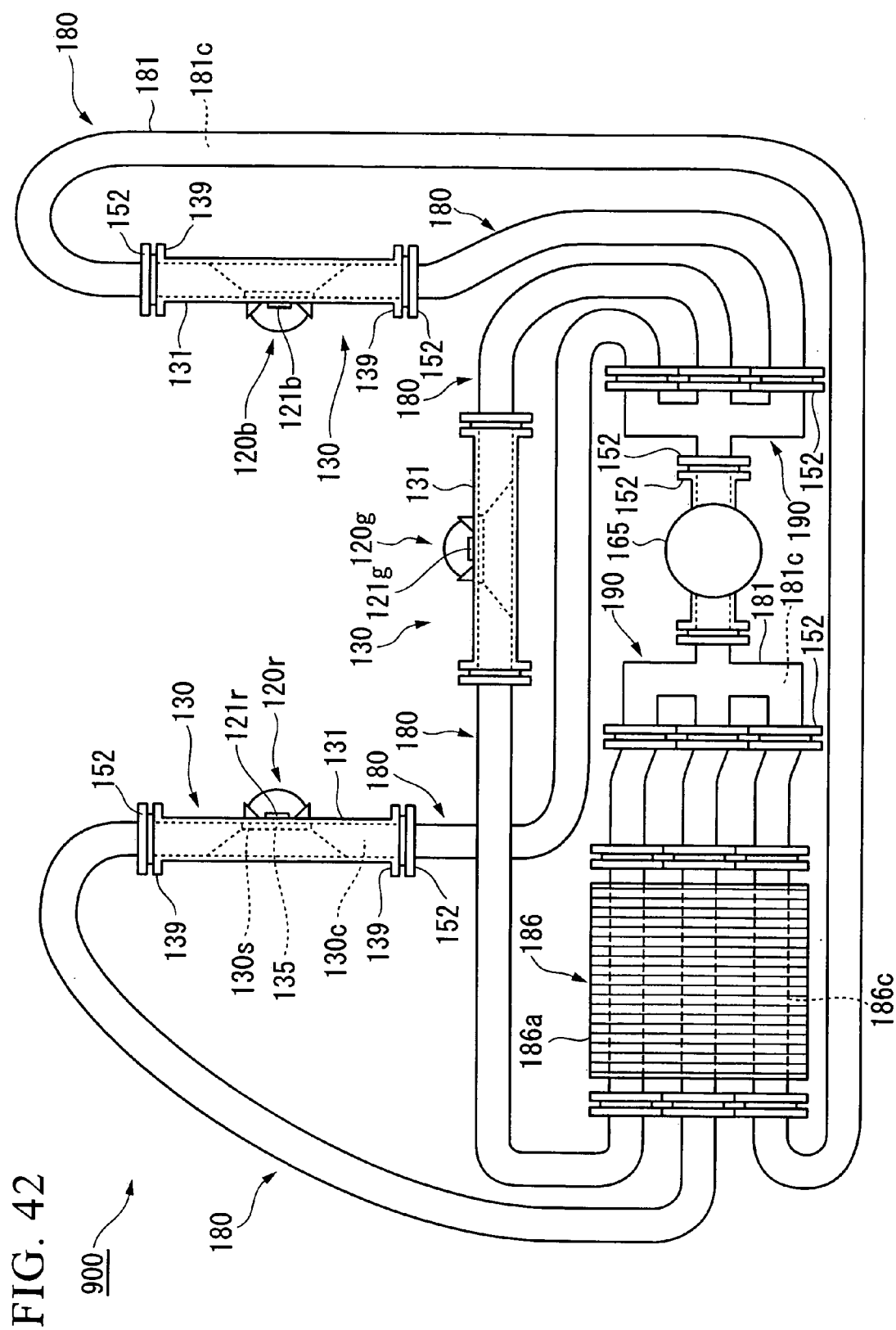
FIG. 42 is a schematic view of a light source apparatus of a fifth embodiment of the second aspect of the present invention.

FIG. 42 is a schematic view showing a light source apparatus of the projection display apparatus of the second aspect of the present invention.

As shown in FIG. 42, the light source apparatus 900 generally includes light source units 120r, 120g, and 120b that respectively emit red (R), green (G), and blue (B) colored light, mounting units 130 on which the respective light source units 120r, 120g, and 120b are mounted, a circulation portion 180 that defines a portion of the circulation flow path C along which the liquid L circulates, splitting/merging members (i.e., circulation portions) 190 that also define a portion of the circulation flow path C and that either split a single flow path into three flow paths or merge three flow paths into a single flow path, a circulation pump 165 that causes the liquid L to circulate, and a heat dissipation member 186 that dissipates heat from the liquid L to the outside.

As shown in FIG. 42, each splitting/merging member 190 includes four pipe shaped portions 181, in which pipe shaped flow paths 180c are defined, that intersect at one point. The flanges 152 are provided at distal ends of the pipe shaped portions 181. Note that the four pipe shaped sections 181 may intersect at one point, as described above, or may not intersect at one point. It is sufficient if the splitting/merging member 190 has a configuration in which the liquid L that is flowing in one pipe shaped flow path 180c is split so as to flow into the other three pipe shaped flow paths 180c, or in which the liquid L that is flowing in three pipe shaped flow paths 180c is merged into the remaining pipe shaped flow path 180c.

The mounting units 130 on which the respective light source units 120r, 120g, and 120b are mounted are coupled in parallel by the circulation portions 180 and the splitting/merging members 190. That is, a circuit is formed in which, starting from the mounting unit 130 on which the light source unit 120r is mounted in the flow direction of the liquid L, are connected in this sequence the circulation portion 180, the splitting/merging member 190, the circulation pump 165, the splitting/merging member 190, the circulation portion 180, and the heat dissipation member 186, the circulation portion 180, the mounting unit 130 on which the light source unit 120r is mounted. A further circuit is formed in which, starting from the mounting unit 130 on which the light source unit 120g is mounted in the flow direction of the liquid L, are connected in this sequence the circulation portion 180, the splitting/merging member 190, the circulation pump 165, the splitting/merging member 190, the circulation portion 180, the heat dissipation member 186, the circulation portion 180, the mounting unit 130 on which the light source unit 120g is mounted. In addition, a further circuit is formed in which, starting from the mounting unit 130 on which the light source unit 120b is mounted in the flow direction of the liquid L, are connected in this sequence the circulation portion 180, the splitting/merging member 190, the circulation pump 165, the splitting/merging member 190, the circulation portion 180, the heat dissipation member 186, the circulation portion 180, the mounting unit 130 on which the light source unit 120b is mounted. These three parallel circuits are formed so as to share a single circulation pump 165 and heat dissipation member 186.

Next, a description will be given of the operation of the light source apparatus 900 having the above-described structure. Note that, because the emission of light from the light source units 120r, 120g, and 120b is the same as in the first embodiment, a description thereof is omitted.

A description of the cooling of the light source unit 120r, 120g, and 120b in the light source apparatus 900 will now be given. Note that, because the cooling operation inside the mounting unit 130 is the same as in the first embodiment, a description thereof is omitted.

The liquid L is forwarded under pressure by the circulation pump 165. It is then split by the splitting/merging member 190 and flows into the heat dissipation member 186. The heat from the liquid L is transported from the liquid L to the cooling fin 186, and is dissipated to the outside, for example, to the air. As a result, the liquid L is cooled. The cooled liquid L then flows into the mounting unit 130 on which the light source unit 120r is mounted. The liquid L that has flowed into the mounting unit 130 removes heat from the LED chip 121r, and merges in the splitting/merging member 190 with the liquid L flowing in the other flow paths. It is then once again sent under pressure by the circulation pump 165 into the heat dissipation member 186.

The liquid L that is split in the splitting/merging member 190 is cooled in the heat dissipation member 186, and flows into the mounting unit 130 on which the light source unit 120g is mounted. The liquid L that has flowed into the mounting unit 130 removes heat from the LED chip 121g, and merges in the splitting/merging member 190 with the liquid L flowing in the other flow paths. It is then once again sent under pressure by the circulation pump 165 into the heat dissipation member 186.

Furthermore, the liquid L that is split in the splitting/merging member 190 is cooled in the heat dissipation member 186, and flows into the mounting unit 130 on which the light source unit 120b is mounted. The liquid L that has flowed into the mounting unit 130 removes heat from the LED chip 121b, and merges in the splitting/merging member 190 with the liquid L flowing in the other flow paths. It is then once again sent under pressure by the circulation pump 165 into the heat dissipation member 186.

According to the above-described structure, it is possible to cause the liquid L to circulate in parallel to the three LED chips 121r, 121g, and 121b using a single circulation pump 165 and circulation portions 180 and splitting/merging member 190. Accordingly, the heat generated from the LED chips 121r, 121g, and 121b is carried to a single heat dissipation member 186, and can be dissipated from there to the outside.

That is, it is possible for the number of circulation pumps and heat dissipation members that are reduced to be decreased to fewer than when a circulation pump and heat dissipation member are provided for each of the LED chips that each emit a different colored light. As a result, the manufacturing costs and manufacturing steps needed to manufacture the light source apparatus 900 and projection display apparatus can be reduced.

Moreover, when the light source apparatus 900 is assembled in the projection display apparatus, because the mounting units 130, the circulation pump 165, and the heat dissipation member 186 are assembled as separate units, and the circulation portions 180 and the splitting/merging member 190 are subsequently assembled, as shown in FIG. 42, even if the light source apparatus 900 has a complex flow path structure, the projection display apparatus can be easily assembled.

Note that the technological scope of the present invention is not limited by the above-described embodiments. Various modifications can be made without departing from the spirit or scope of the present invention.

For example, in these embodiments, an LED chip is employed as the solid state light source; however, it is also possible to employ a semiconductor laser or the like as the solid state light source. Moreover, cooling fins are employed as the cooling means in these embodiments; however, it is also possible to employ a Peltier element and the like as the cooling means. Furthermore, a liquid crystal light bulb is employed as the optical modulator in the above-described projector, however, it is also possible to use a digital micro mirror device (DMD®) and the like as the optical modulator.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. A light source apparatus comprising:
   a solid state light source that emits light;
   a liquid medium that removes heat from the solid state light source; and
   a duct in which the liquid medium flows, the duct including a mounting unit on which the solid state light source is mounted, the mounting unit including a circumferential wall that has a first portion and a second portion facing each other along a direction transverse to the main flow direction of the liquid medium, the first portion made of a metal and having an outer surface on which the solid state light source is mounted, the second portion protruding inwardly and narrowing a flow path of the liquid medium.

2. The light source apparatus according to claim 1, the duct including at least two parts welded together.

3. The light source apparatus according to claim 1, the first portion of the circumferential wall of the mounting unit having electroconductivity, and power being supplied to the solid state light source via the first portion.

4. The light source apparatus according to claim 1, second portion of the circumferential wall of the mounting unit having a cross-section having a substantially trapezoid shape with the narrower base thereof facing the first portion of the circumferential wall.

5. The light source apparatus according to claim 1, mounting unit further including at least one member that is provided between the first and the second portions of the circumferential wall and that substantially divides a flow path between the first and the second portions.

6. The light source apparatus according to claim 1, the mounting unit further including a turbulent flow generating member that disturbs a flow of the liquid medium between the first and the second portions of the circumferential wall.

7. The light source apparatus according to claim 1,
   the flow path in the duct having a circulation flow path, and
   the duct further including a circulation pump and a heat dissipation member that dissipates heat from the liquid medium.

8. A projection display apparatus comprising:
   the light source apparatus according to claim 1;
   an optical modulator that modulates light form the light source apparatus; and
   a projection device that projects light that has been modulated by the optical modulator.

9. A light source apparatus comprising:
   a solid state light source that emits light;
   a liquid medium that absorbs heat from the solid state light source;
   a duct in which the liquid medium flows circularly, the duct including a mounting unit that has a pipe shape and on which the solid state light source is mounted, the mounting unit being detachably attached to the duct, the mounting unit including a circumferential wall that has a first portion and a second portion facing each other along a direction transverse to the main flow direction of the liquid medium, the first portion being made of a metal and having an outer surface on which the solid state light source is mounted, the second portion protruding inwardly and narrowing a flow path of the liquid medium;
   a heat dissipation unit that dissipates heat from the liquid medium flowing in the duct; and
   a circulation pump that cause the liquid medium to circulate.

10. The light source apparatus according to claim 9,
    the duct further including at least one pipe-shaped member that fluidically connects the mounting unit, the heat dissipation unit, and the circulation pump, and wherein
    the dissipation unit and the circulation pump being detachably attached to the duct.

11. The light source apparatus according to claim 9, a flange for connecting being provided on the mounting unit, the dissipation unit, and the circulation pump, respectively.

12. The light source apparatus according to claim 9, the circulation pump having at least two circulation pumps that are detachably attached to the duct.

13. The light source apparatus according to claim 9, the dissipation unit being detachable from the duct, in consort with the circulation pump.

14. The light source apparatus according to claim 11, the pipe-shaped member having flexibility.

15. A projection display apparatus comprising:
    a light source apparatus according to claim 9;
    an optical modulator that modulates light form the light source apparatus; and
    a projection device that projects light that has been modulated by the optical modulator.

* * * * *